US012308258B2

(12) United States Patent
Takahashi et al.

(10) Patent No.: US 12,308,258 B2
(45) Date of Patent: May 20, 2025

(54) SUBSTRATE PROCESSING APPARATUS AND SUBSTRATE PROCESSING METHOD

(71) Applicant: SCREEN HOLDINGS CO., LTD., Kyoto (JP)

(72) Inventors: Tomohiro Takahashi, Kyoto (JP); Takuya Kishida, Kyoto (JP); Masayuki Orisaka, Kyoto (JP); Kei Takechi, Kyoto (JP)

(73) Assignee: SCREEN HOLDINGS CO., LTD. (JP)

(*) Notice: Subject to any disclaimer, the term of this patent is extended or adjusted under 35 U.S.C. 154(b) by 301 days.

(21) Appl. No.: 17/788,142

(22) PCT Filed: Dec. 24, 2020

(86) PCT No.: PCT/JP2020/048378
§ 371 (c)(1),
(2) Date: Jun. 22, 2022

(87) PCT Pub. No.: WO2021/132443
PCT Pub. Date: Jul. 1, 2021

(65) Prior Publication Data
US 2023/0121666 A1    Apr. 20, 2023

(30) Foreign Application Priority Data
Dec. 26, 2019  (JP) .................. 2019-236759
Aug. 12, 2020  (JP) .................. 2020-136163

(51) Int. Cl.
H01L 21/67      (2006.01)
H01L 21/306     (2006.01)

(52) U.S. Cl.
CPC .. *H01L 21/67086* (2013.01); *H01L 21/30604* (2013.01)

(58) Field of Classification Search
CPC ........ H01L 21/30604; H01L 21/67086; H01L 21/31111
See application file for complete search history.

(56) References Cited

U.S. PATENT DOCUMENTS 5,000,795 A * 3/1991 Chung .............. H01L 21/67051
134/25.4
5,503,171 A * 4/1996 Yokomizo ......... H01L 21/67057
134/182

(Continued)

FOREIGN PATENT DOCUMENTS

CN    101271833 B    12/2010
CN    105742150 A    7/2016

(Continued)

OTHER PUBLICATIONS

International Search Report mailed Mar. 23, 2021 in corresponding PCT International Application No. PCT/JP2020/048378.

(Continued)

*Primary Examiner* — Yuechuan Yu
(74) *Attorney, Agent, or Firm* — OSTROLENK FABER LLP

(57) ABSTRACT

At least part of a processing liquid upward flowing in a storage space is split into a plurality of upflows and guided to a substrate held by a substrate holder. Many upflows are widely dispersed and formed in the processing liquid stored in the storage space, and the generation of downflows in the storage space is suppressed. As a result, bubbles are uniformly supplied to the substrate and substrate processing can be performed in high quality.

17 Claims, 12 Drawing Sheets

(56) References Cited

U.S. PATENT DOCUMENTS

| | | |
|---|---|---|
| 2006/0269686 A1 | 11/2006 | Lin et al. .................. 427/457 |
| 2007/0223916 A1 | 9/2007 | Higuchi et al. ............. 396/611 |
| 2008/0230101 A1 | 9/2008 | Hayashi ...................... 134/57 |
| 2009/0239384 A1 | 9/2009 | Fujiwara et al. ............ 438/745 |
| 2010/0031983 A1 | 2/2010 | Ootaguro ..................... 134/56 |
| 2011/0240224 A1 | 10/2011 | Yoshimura et al. ..... 156/345.47 |
| 2018/0025927 A1 | 1/2018 | Masutomi et al. |
| 2018/0169712 A1 | 6/2018 | Yasuda et al. |
| 2018/0218924 A1 | 8/2018 | Tanaka et al. |
| 2018/0247839 A1 | 8/2018 | Kurasaki et al. |
| 2019/0148176 A1* | 5/2019 | Tanaka .............. H01L 21/67028 |
| | | 156/345.11 |
| 2019/0259639 A1 | 8/2019 | Nakaoka et al. |
| 2020/0098597 A1* | 3/2020 | Takahashi ............. H01L 21/302 |

FOREIGN PATENT DOCUMENTS

| | | | |
|---|---|---|---|
| CN | 107644824 A | 1/2018 | |
| CN | 108206149 A | 6/2018 | |
| CN | 108376660 A | 8/2018 | |
| JP | H02-054528 A | 2/1990 | |
| JP | H06-179976 A | 6/1994 | |
| JP | H07-022371 A | 1/1995 | |
| JP | H11-026419 A | 1/1999 | |
| JP | H11-102888 A | 4/1999 | |
| JP | 2010-040758 A | 2/2010 | |
| JP | 2012-114228 A | 6/2012 | |
| JP | 2015-204384 A | 11/2015 | |
| JP | 2016-200821 A | 12/2016 | |
| JP | 2017-069529 A | 4/2017 | |
| JP | 2018-014470 A | 1/2018 | |
| JP | 2019-145686 A | 8/2019 | |
| TW | 201001586 A | 1/2010 | |
| TW | I329341 B | 8/2010 | |
| TW | I666066 B | 7/2019 | |

OTHER PUBLICATIONS

Written Opinion mailed Mar. 23, 2021 in corresponding PCT International Application No. PCT/JP2020/048378.
Office Action dated Jan. 7, 2022 of the corresponding Taiwan Patent Application No. 109146231.
Korean Office Action dated Oct. 30, 2023 issued in corresponding Korean Patent Application No. 10-2022-7019487. English translation attached.
Chinese Office Action dated Nov. 15, 2024 issued in corresponding Chinese Patent Application No. 202080089352.2.

* cited by examiner

SUBSTRATE PROCESSING APPARATUS AND SUBSTRATE PROCESSING METHOD

CROSS-REFERENCE TO RELATED APPLICATIONS

The present application is a 35 U.S.C. §§ 371 national phase conversion of International Application No. PCT/JP2020/048378, filed Dec. 24, 2020, which claims priority to Japanese Patent Application No. 2019-236759, filed Dec. 26, 2019, and Japanese Patent Application No. 2020-136163, filed Aug. 12, 2020, the contents of which are incorporated herein by reference.

TECHNICAL FIELD

This invention relates to a substrate processing apparatus and a substrate processing method for processing a substrate by immersing the substrate into a processing liquid such as a chemical or pure water stored in a processing tank while overflowing the processing liquid from the processing tank.

The disclosure of Japanese Patent Applications enumerated below including specifications, drawings and claims is incorporated herein by reference in its entirety:

No.2019-236759 filed on Dec. 26, 2019; and

No.2020-136163 filed on Aug. 12, 2020.

BACKGROUND

In the field of manufacturing a semiconductor device, a technique for forming recesses having a high aspect ratio is desired to cope with a higher density and a larger capacity of the semiconductor device. For example, a manufacturing process of a three-dimensional NAND nonvolatile semiconductor device (hereinafter, referred to as a "3D-NAND memory") includes a step of, after recesses are formed in a lamination direction in a laminate formed by laminating a multitude of silicon oxide films ($SiO_2$ films) and silicon nitride films (SiN films), removing the SiN films via the recesses by wet etching. To perform this step, it has been studied to use, for example, a substrate processing apparatus described in patent literature 1.

In the case of performing the wet etching using the substrate processing apparatus, a chemical containing a phosphoric acid, which is an example of an etchant for the SiN films, is used as a processing liquid. More specifically, in the substrate processing apparatus, an ejection pipe is arranged in an inner bottom part of a storage space formed inside a processing tank, and the processing liquid is supplied into the storage space from this ejection pipe. Thus, in the processing tank, only a certain amount of the processing liquid is stored in the processing tank while the processing liquid is overflowing from the processing tank. Then, the substrate having the above recess structure is immersed in the processing liquid stored in the processing tank. Further, in the substrate processing apparatus, a bubble supply pipe is arranged in the inner bottom part of the storage space, similarly to the ejection pipe, and bubbles are supplied toward an overflow surface from the inner bottom part of the storage space. These bubbles ascend in the processing liquid and are supplied to the substrate. A fresh processing liquid can be quickly and continuously supplied to the recesses by the supply of such bubbles to the substrate.

CITATION LIST

Patent Literature

Patent literature 1: JP 2016-200821A

SUMMARY

Technical Problem

However, the apparatus described in patent literature 1 had the following problem. A liquid flow moving to the overflow surface, i.e. an upflow of the processing liquid, is formed in the storage space by the spouting of the processing liquid from the ejection pipe. Most of the processing liquid having reached an upper opening of the storage space overflows, but part of the processing liquid flows downward from the vicinity of the overflow surface without overflowing. A so-called downflow is generated in the storage space. This downflow is one of main causes for reducing uniform supply of bubbles to the substrate by hindering the ascent of bubbles to the overflow surface. As a result, the quality of substrate processing is reduced.

This invention was developed in view of the above problem and aims to enhance processing quality by uniformly supplying bubbles to a substrate in a substrate processing technique for processing the substrate by immersing the substrate into a processing liquid stored in a processing tank while overflowing the processing liquid from the processing tank and supplying the bubbles to the substrate in the processing liquid.

Solution to Problem

A first aspect of the invention is a substrate processing apparatus. The substrate processing apparatus comprises: a processing tank, having a storage space, configured to process a substrate that is immersed into a processing liquid stored in the storage space and overflowed from an upper opening of the storage space; a substrate holder configured hold the substrate in a standing posture in the storage space; a processing liquid discharger including a processing liquid discharge port configured to discharge the processing liquid on a side below the substrate held by the substrate holder, the processing liquid discharger causing the processing liquid discharged from the processing liquid discharge port to flow toward an inner bottom surface of the storage space; and a bubble supplier provided on a side below the substrate held by the substrate holder and above the processing liquid discharge port and configured to supply bubbles to the processing liquid stored in the storage space, wherein at least part of the processing liquid flowing upward by way of the inner bottom surface of the storage space becoming a liquid to be split between the bubble supplier and the inner bottom surface of the storage space in a vertical direction, and a flow of the liquid to be split is split into a plurality of upflows and guided to the substrate held by the substrate holder.

A second aspect of the invention is a substrate processing method. The substrate processing method comprises: an overflow step of storing a processing liquid in a storage space provided in a processing tank by discharging the processing liquid into the storage space and overflowing the processing liquid from an upper opening of the storage space; an immersion step of immersing the substrate into the processing liquid stored in the storage space; and a bubble supply step of supplying bubbles from a bubble supplier from a side below the substrate immersed in the processing liquid in the storage space, the overflow step being performed in parallel with the immersion step and the bubble supply step, the overflow step at least partially splitting a flow of the processing liquid flowing upward by way of an inner bottom surface of the storage space into a plurality of upflows between the bubble supplier and the inner bottom surface of the storage space and guiding the plurality of upflows to the substrate.

Effect of the Invention

As described above, according to the invention, many upflows are widely dispersed and formed in the processing liquid stored in the storage space, and the generation of downflows in the storage space is suppressed. As a result, bubbles are uniformly supplied to the substrate and substrate processing can be performed in high quality.

All of a plurality of constituent elements of each aspect of the invention described above are not essential and some of the plurality of constituent elements can be changed, deleted or replaced by new other constituent elements or limitation contents can be partially deleted as appropriate to solve some or all of the problems described above or achieve some or all of effects described in this specification. Further, some or all of technical features included in one aspect of the invention described above can be combined with some or all of technical features included in another aspect of the invention described above into one independent aspect of the invention to solve some or all of the problems described above or achieve some or all of effects described in this specification.

DESCRIPTION OF EMBODIMENTS

Figure 1:
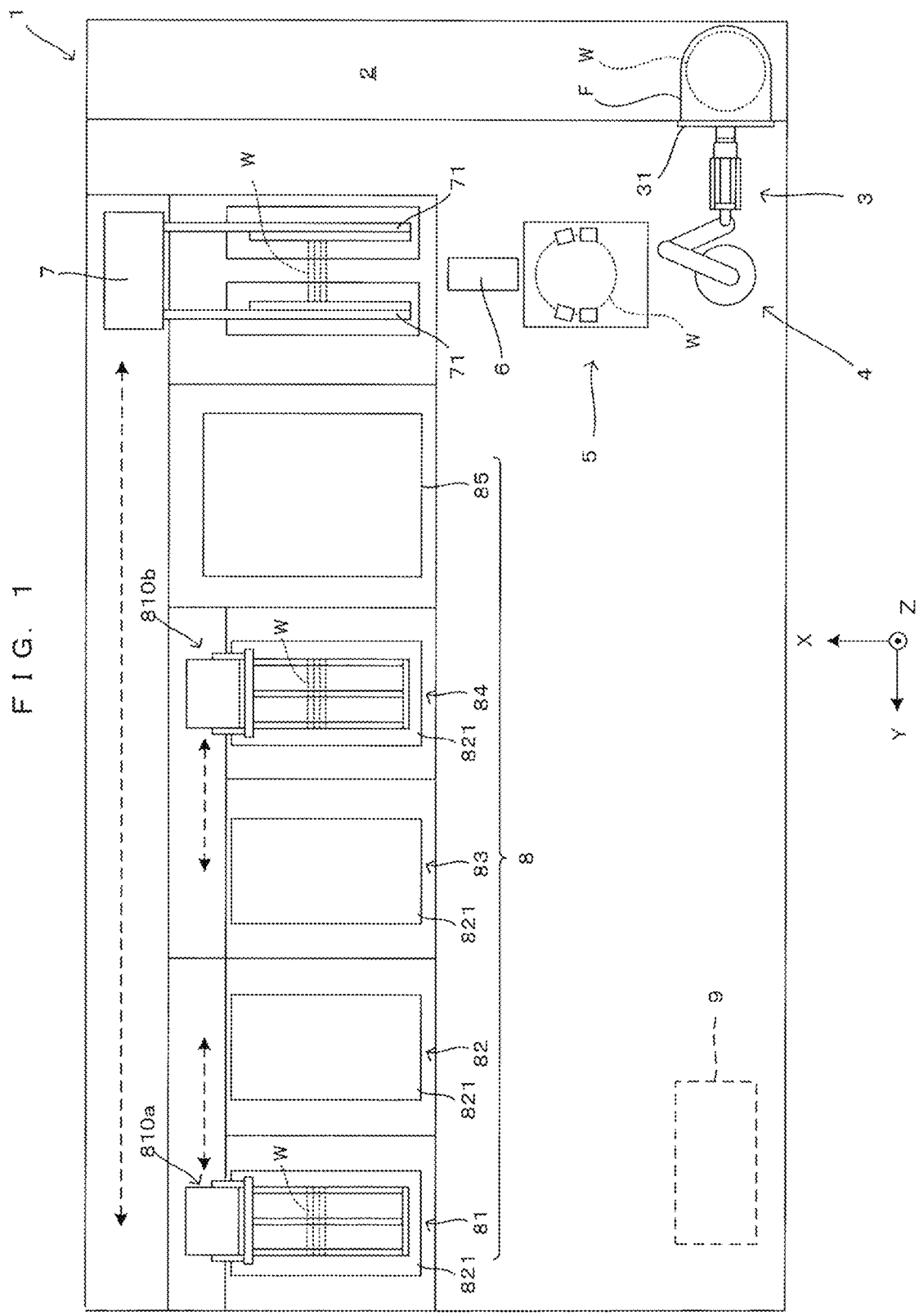
FIG. 1 is a plan view showing a schematic configuration of a substrate processing system equipped with a first embodiment of a substrate processing apparatus according to the invention.

FIG. 1 is a plan view showing a schematic configuration of a substrate processing system equipped with a first embodiment of a substrate processing apparatus according to the invention. The substrate processing system 1 includes a container placing unit 2, a shutter driving mechanism 3, a substrate transfer robot 4, a posture conversion mechanism 5, a pusher 6, a substrate conveying mechanism 7, a processing unit 8, and a controller 9. XYZ orthogonal coordinate axes are set as shown in FIG. 1 to show directions in each figure in a unified manner below. Here, an XY plane represents a horizontal plane. Further, a Z axis represents a vertical axis, more particularly, a Z direction is a vertical direction.

In the container placing unit 2, a container storing substrates W is placed. In this embodiment, a hoop F configured such that a plurality of (e.g. 25) substrates W in a horizontal posture can be stored in a state stacked in the Z direction is used as an example of the container. The hoop F is placed on the container placing unit 2 while storing the unprocessed substrates W, and placed on the container placing unit 2 in an empty state to store the processed substrates W. The substrates W to be stored in the hoop F are semiconductor wafers for forming a 3D-NAND memory and have recesses having a high aspect ratio in this embodiment.

The shutter driving mechanism 3, the substrate transfer robot 4, the posture conversion mechanism 5, the pusher 6, the substrate conveying mechanism 7 and the processing unit 8 are arranged in a process space adjacent to the container placing unit 2 on a (+Y) side. The container placing unit 2 and the process space are defined by a separation wall (not shown) equipped with an openable/closable shutter 31. The shutter 31 is connected to the shutter driving mechanism 3. The shutter driving mechanism 3 closes the shutter 31 to spatially separate the container placing unit 2 and the process space in response to a close command from the controller 9. Conversely, the shutter driving mechanism 3 opens the shutter 31 and allows communication between the container placing unit 2 and the process space in response to an open command from the controller 9. In this way, the unprocessed substrates W can be carried into the process space from the hoop F and the processed substrates W can be carried out into the hoop F.

The substrates W are carried in and out as described above by the substrate transfer robot 4. The substrate transfer robot 4 is configured to be swingable in a horizontal plane. The substrate transfer robot 4 transfers the plurality of substrates W between the posture conversion mechanism 5 and the hoop F with the shutter 31 opened. Further, the posture conversion mechanism 5 converts the postures of the plurality of substrates W between a standing posture and a horizontal posture after the substrate W are received from the hoop F via the substrate transfer robot 4 and before the substrates W are transferred to the hoop F.

The pusher 6 is arranged on the side of the substrate conveying mechanism 7 (+X side in FIG. 1) with respect to the posture conversion mechanism 5, and transfers the plurality of substrates W in the standing posture between the posture conversion mechanism 5 and the substrate conveying mechanism 7. Further, the substrate conveying mechanism 7 moves in the horizontal direction along an arrangement direction (Y direction in FIG. 1), in which processors 81 to 85 constituting the processing unit 8 are arranged, from a position facing the pusher 6 (hereinafter, referred to as a "standby position") as shown in FIG. 1.

The substrate conveying mechanism 7 includes a pair of suspension arms 71. Collective holding of the plurality of substrates W and the release of holding can be switched by swinging movements of this pair of suspension arms 71. More specifically, the plurality of substrates W are released by the lower edges of the respective arms 71 swinging about a horizontal axis in directions away from each other, and are sandwiched and held by the lower edges of the respective arms 71 swinging about the horizontal axis in directions toward each other. Although not show in FIG. 1, the substrate conveying mechanism 7 includes an arm mover and an arm swinger. Out of these, the arm mover functions to horizontally move the pair of suspension arms 71 along the arrangement direction Y of the processors 81 to 85. Thus, the pair of suspension arms 71 are positioned at positions facing the respective processors 81 to 85 (hereinafter, referred to as "processing positions") and the standby position by these horizontal movements.

On the other hand, the arm swinger functions to perform the arm swinging operation, and switches a holding state where the substrates W are sandwiched and held and a releasing state where the sandwiching of the substrates W is released. Thus, the substrates W can be transferred between lifters 810 and the suspension arms 71 by this switching operation and vertical movements of the lifter 810a functioning as a substrate holder for the processors 81, 82 and the lifter 810b functioning as a substrate holder for the processors 83, 84. Further, at the processing position facing the processor 85, the substrates W can be transferred between the processor 85 and the suspension arms 71. Furthermore, at the standby position, the substrates W can be transferred between the posture conversion mechanism 5 and the suspension arms 71 via the pusher 6.

As described above, the processing unit 8 is provided with the five processors 81 to 85, which respectively function as a first chemical processor 81, a first rinsing processor 82, a second chemical processor 83, a second rinsing processor 84 and a dry processor 85. Out of these, in the first and second chemical processors 81, 83, the same type or different types of chemicals are stored in processing tanks 821 and a chemical processing is applied by collectively immersing the plurality of substrates W in the chemical. In each of the first and second rinsing processors 82, 84, a rinse liquid (e.g. pure water) is stored in a processing tank 821 and a rinse processing is applied to the surfaces of the plurality of substrates W by collectively immersing the substrates W into the rinse liquid. These first chemical processor 81, first rinsing processor 82, second chemical processor 83 and second rinsing processor 84 correspond to the first embodiment of the substrate processing apparatus according to the invention, and have the same basic configuration although the types of the processing liquids are different. Note that apparatus configurations and operations are described in detail later with reference to FIGS. 2 to 5.

As shown in FIG. 1, the first chemical processor 81 and the first rinsing processor 82 adjacent to the first chemical processor 81 are paired, and the second chemical processor 83 and the second rinsing processor 84 adjacent to the second chemical processor 83 are paired. The lifter 810a functions not only as a "substrate holder" of the invention in the first chemical processor 81 and the first rinsing processor 82, but also as a dedicated conveying mechanism for transferring the substrates W chemically processed in the first chemical processor 81 to the first rinsing processor 82. Further, the lifter 810b functions not only as the "substrate holder" of the invention in the second chemical processor 83 and the second rinsing processor 84, but also as a dedicated conveying mechanism for transferring the substrates W chemically processed in the second chemical processor 83 to the second rinsing processor 84.

In the processing unit 8 configured as just described, three supporting members (812 in FIG. 2) of the lifter 810a collectively receive the plurality of substrates W from the pair of suspension arms 71 of the substrate conveying mechanism 7, and lower the substrates W into the processing liquid in the processing tank of the first chemical processor 81 and immerse the substrates W into the chemical (immersion step) while an overflow step of overflowing the processing liquid from the processing tank and an bubble supply step of supplying bubbles into the processing liquid stored in the processing tank are performed as described in detail later. Further, after waiting for a predetermined chemical processing time, the lifter 810a pulls up the supporting members holding the plurality of substrates W from the chemical, horizontally moves the supporting members to the first rinsing processor 82 and further lowers the supporting members holding the chemically processed substrates W into the processing tank (821 in FIG. 2) of the first rinsing processor 82 and immerses the supporting members into the rinse liquid. After waiting for a predetermined rinsing time, the lifter 810a pulls up the substrates W from the rinse liquid by lifting the supporting members holding the rinsed substrates W. Thereafter, the plurality of substrates W are collectively transferred from the supporting members of the lifter 810a to the pair of suspension arms 71 of the substrate conveying mechanism 7.

Similarly, the lifter 810b collectively receives the plurality of substrates W from the pair of suspension arms 71 of the substrate conveying mechanism 7, and lowers the plurality of substrates W into the processing tank of the second chemical processor 83 and immerses the substrates W into the chemical. Further, after waiting for a predetermined chemical processing time, the lifter 810b pulls up the plurality of chemically processed substrates W from the chemical by lifting supporting members, horizontally moves the supporting members to the processing tank of the second rinsing processor 84 and further lowers the supporting members into the processing tank 821 of the second rinsing processor 84 and immerses the supporting members into the rinse liquid. After waiting for a predetermined rinsing time, the lifter 810b pulls up the substrates W from the rinse liquid by lifting the supporting members. Thereafter, the plurality of substrates W are collectively transferred from the lifter 810*b* to the substrate conveying mechanism 7. Note that a lifter functioning as the "substrate holder" of the invention may be provided in each of the first chemical processor 81, the first rinsing processor 82, the second chemical processor 83 and the second rinsing processor 84, whereas the substrates W may be carried into and out from the processors 81 to 84 by the substrate conveying mechanism 7 and dedicated conveying mechanisms.

The dry processor 85 includes a substrate holding member (not shown) capable of holding a plurality of (e.g. 52) substrates W arranged in a standing posture, and dries the substrates W by supplying an organic solvent (isopropyl alcohol or the like) to the substrates W in a reduced-pressure atmosphere and spinning off liquid components on the surfaces of the substrates W by a centrifugal force. This dry processor 85 is configured such that the substrates W can be transferred to and from the pair of suspension arms 71 of the substrate conveying mechanism 7. The plurality of substrates W after the rinse processing are collectively received from the substrate conveying mechanism 7, and dry processing is applied to the plurality of substrates W. Further, after dry processing, the plurality of substrates W are collectively transferred from the substrate holding member to the substrate conveying mechanism 7.

Next, the substrate processing apparatuses according to the invention are described. The first chemical processor 81, the first rinsing processor 82, the second chemical processor 83, and the second rinsing processor 84 equipped in the substrate processing system shown in FIG. 1 have basically the same apparatus configuration and operation although the processing liquids used are partly different. Accordingly, the configuration and operation of the first chemical processor 81 corresponding to the first embodiment of the substrate processing apparatus according to the invention are described below, and the description on the first rinsing processor 82, the second chemical processor 83, and the second rinsing processor 84 is omitted.

Figure 2:
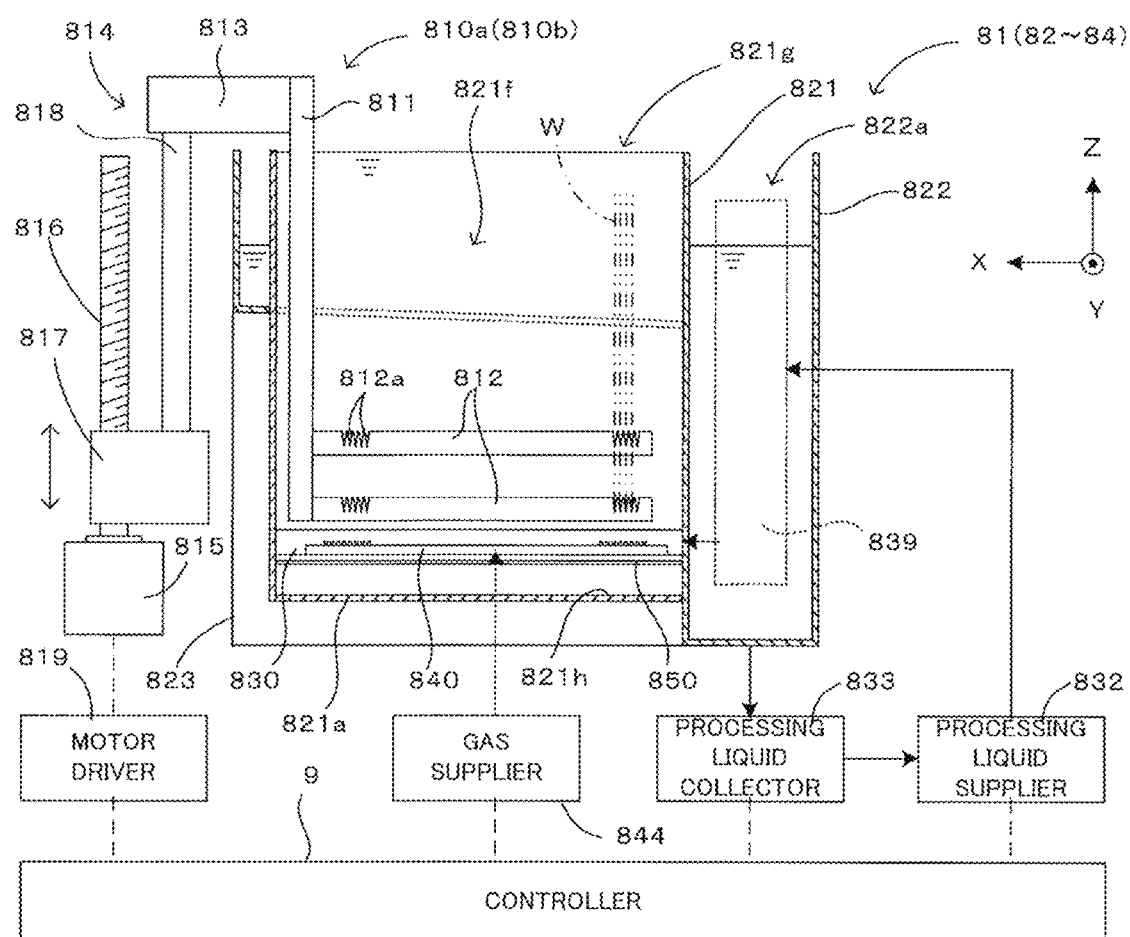
FIG. 2 is a diagram showing a schematic configuration of the first embodiment of the substrate processing apparatus according to the invention.
Figure 3:
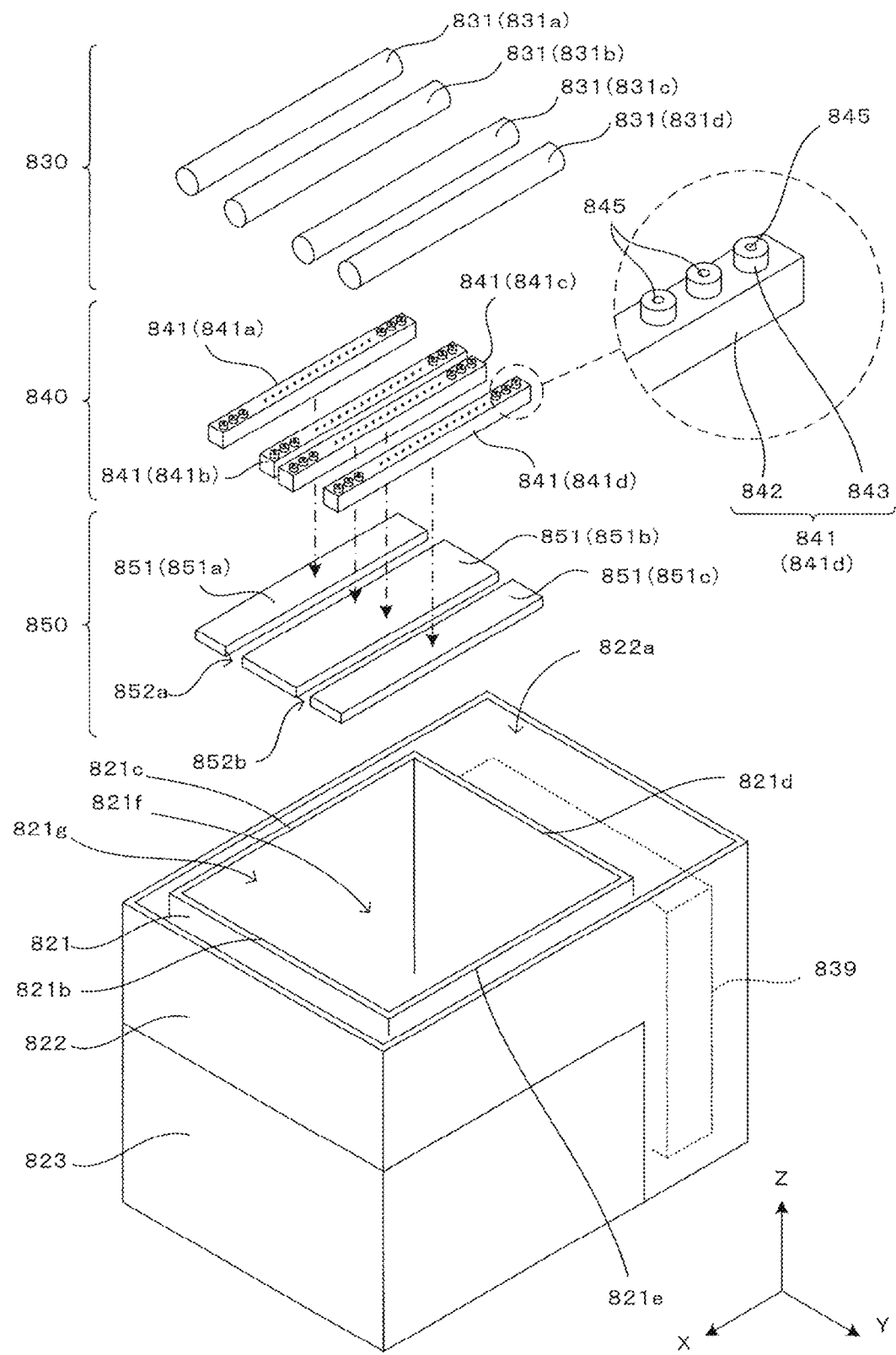
FIG. 3 is an exploded assembly perspective view schematically showing a main configuration of the substrate processing apparatus shown in FIG. 2.
Figure 4:
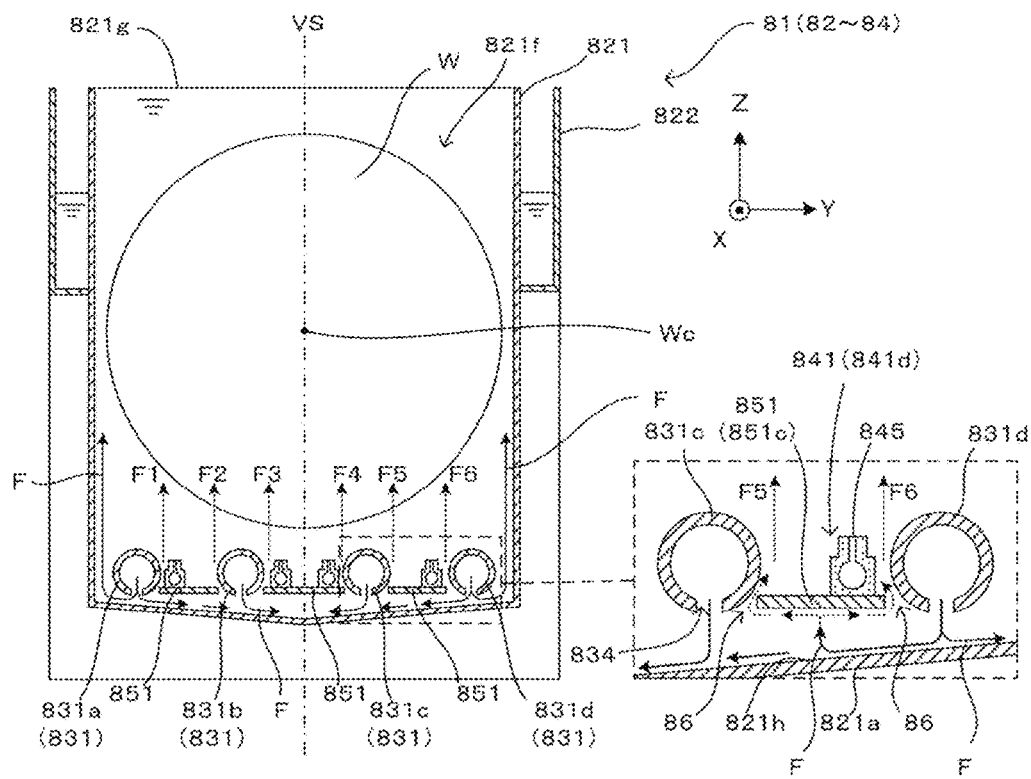
FIG. 4 is a partial sectional view of FIG. 2.
Figure 5:
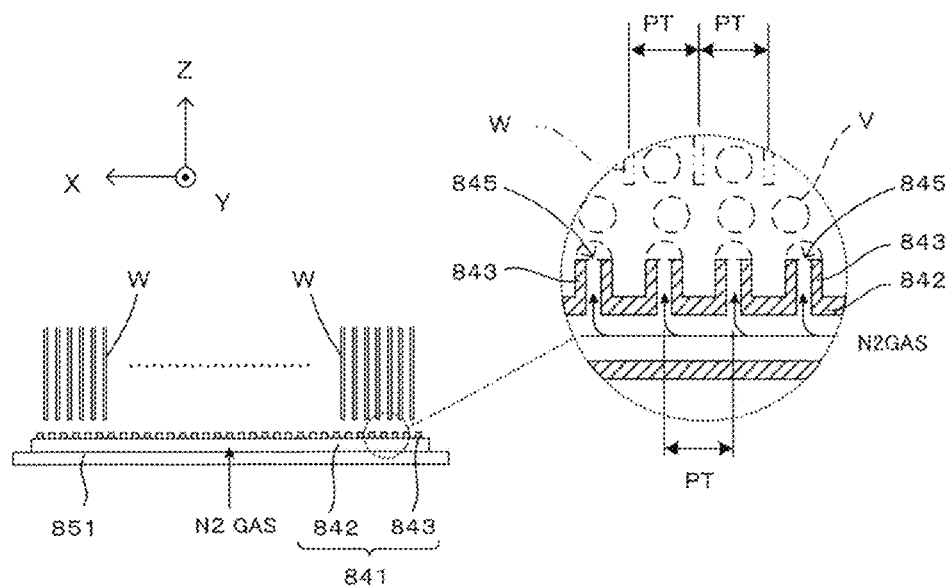
FIG. 5 is a diagram showing an arrangement relationship of a plurality of substrates held by a lifter and bubble discharge ports.

FIG. 2 is a diagram showing a schematic configuration of the first embodiment of the substrate processing apparatus according to the invention. FIG. 3 is an exploded assembly perspective view schematically showing a main configuration of the substrate processing apparatus shown in FIG. 2. FIG. 4 is a partial sectional view of FIG. 2. FIG. 5 is a diagram showing an arrangement relationship of a plurality of substrates held by a lifter and bubble discharge ports. The first chemical processor 81 is an apparatus for etching and removing silicon nitride films via the recesses formed in the surfaces of the substrates W using, for example, a chemical containing a phosphoric acid as the processing liquid. This first chemical processor 81 includes the processing tank 821 used to perform a first chemical processing to the substrates W as shown in FIGS. 2 and 3. This processing tank 821 has a box structure open upward and composed of a bottom wall 821*a* rectangular in a plan view and four side walls 821*b* to 821*e* rising from and around the bottom wall 821*a*. Thus, the plurality of substrates W held by the lifter 810*a* can be collectively immersed into the processing liquid stored in a storage space 821*f* of the processing tank 821 surrounded by the bottom wall 821*a* and the side walls 821*b* to 821*e*. Further, the processing tank 821 includes an upper opening 821*g* open in a (+Z) direction and the processing liquid can be overflowed from the storage space 821*f*.

An overflow tank 822 is provided around the processing tank 821, and a collection space 822*a* for collecting the overflowed processing liquid is formed by the overflow tank 822 and the side walls 821*b* to 821*e* of the processing tank 821. Further, an outer container 823 is provided to surround lower sides and lateral sides of the processing tank 821 and the overflow tank 822.

A flow piping system 839 is arranged in a part of the collection space 822*a* of the overflow tank 822, more specifically, in a space on a (−X) side of the side wall 821*d*. An inlet of the flow piping system 839 is connected to a processing liquid supplier 832, and an outlet thereof is connected to flow pipes 831 of a processing liquid discharger 830. Thus, if the processing liquid supplier 832 operates in response to a processing liquid supply command from the controller 9, the processing liquid is simultaneously supplied to a plurality of the flow pipes 831 via the flow piping system 839. As a result, the processing liquid is discharged from the flow pipes 831 and stored in the storage space 821*f*. Note that the detailed configuration and the like of the flow pipes 831 are described in detail later.

Further, the processing liquid overflowed from the processing tank 821 is collected into the overflow tank 822. A processing liquid collector 833 is connected to this overflow tank 822. If the processing liquid collector 833 operates in response to a processing liquid collection command from the controller 9, the processing liquid collected into the overflow tank 822 is fed to the processing liquid supplier 832 by way of the processing liquid collector 833 and used again. As just described, in this embodiment, the processing liquid can be stored in the storage space 821*f* while being circulated and supplied to the processing tank 821.

To immerse the plurality of substrates W into the storage space 821*f* having the processing liquid stored therein while collectively holding the substrates W, the lifter 810*a* is provided as shown in FIG. 2. This lifter 810*a* is configured to move upward and downward between a "transfer position" where the plurality of substrates W are transferred to and from the substrate conveying mechanism 7 (FIG. 1) and the storage space 821*f*. The lifter 810*a* includes a back plate 811, the three supporting members 812 and an extending member 813. The back plate 811 extends toward the bottom wall 821*a* along the side wall 821*b* of the processing tank 821. The supporting members 812 extend in a (−X) direction from a side surface of a lower end part of the back plate 811.

In this embodiment, the three supporting members 812 are provided. In each supporting member 812, a plurality of V-shaped grooves 812*a* are disposed at constant pitches in the X direction. Each V-shaped groove 812*a* slightly wider than a thickness of the substrate W is formed open in the (+Z) direction, and can lock the substrate W. Thus, the plurality of substrates W conveyed by the substrate conveying mechanism 7 can be collectively held at constant substrate pitches PT (FIG. 5) by the three supporting members 812. Further, the extending member 813 extends in a (+X) direction from the back surface of an upper end part of the back plate 811. The lifter 810*a* is L-shaped as a whole as shown in FIG. 2. Note that an uppermost position of the lifter 810*a* is set at a height where the substrate conveying mechanism 7 can pass above the supporting members 812 even if the substrate conveying mechanism 7 is holding the plurality of substrates W.

A lifter driving mechanism 814 is provided on a (+X) side of the processing tank 821. The lifter driving mechanism 814 includes an elevation motor 815, a ball screw 816, an elevation base 817, an elevation column 818 and a motor driver 819. The elevation motor 815 is mounted on a frame (not shown) of the substrate processing system 1 with a rotary shaft vertically placed. The ball screw 816 is coupled to the rotary shaft of the elevation motor 815. One side of the elevation base 817 is threadably engaged with the ball screw 816. A base end side of the elevation column 818 is mounted in a central part of the elevation base 817, and the other end side thereof is mounted on the lower surface of the extending member 813. If the motor driver 819 drives the elevation motor 815 in response to an elevating command from the controller 9, the ball screw 816 rotates and the elevation column 818 moves upward together with the elevation base 817. In this way, the supporting members 812 are positioned at the transfer position. Further, if the motor driver 819 drives the elevation motor 815 in response to a lowering command from the controller 9, the ball screw 816 rotates in an opposite direction and the elevation column 818 moves downward together with the elevation base 817. In this way, the plurality of substrates W held by the supporting members 812 are collectively immersed into the processing liquid stored in the storage space 821f.

In the storage space 821f, the processing liquid discharger 830 and a bubble supplier 840 are disposed on a side below the plurality of substrates W held by the supporting members 812, i.e. on a (−Z) side. The processing liquid discharger 830 discharges the processing liquid supplied via the flow piping systems 839 from the processing liquid supplier 832 to the storage space 821f, and the bubble supplier 840 supplies bubbles V (FIG. 5) of a nitrogen gas into the processing liquid stored in the storage space 821f. The processing liquid discharger 830 and the bubble supplier 840 are respectively configured as follows.

As shown in FIGS. 3 and 4, the processing liquid discharger 830 includes the flow pipes 831 extending in the X direction. In this embodiment, four flow pipes 831 are arranged apart from each other in the Y direction. A (−X) end part of each flow pipe 831 is connected to the outlet of the flow piping systems 839, and a (+X) end part thereof is sealed. Further, a plurality of processing liquid discharge ports 834 are perforated in a side wall of each flow pipe 831 to be arranged at constant intervals in the X direction. In this embodiment, as shown in FIG. 4, the respective processing liquid discharge ports 834 are provided to face in the (−Z) direction. Thus, the processing liquid supplied to the flow pipes 831 flows in the (+X) direction in the pipes and is discharged toward the bottom wall 821a, i.e. an inner bottom surface 821h of the storage space 821f, from each processing liquid discharge port 834. Then, the processing liquid flows upward by way of the inner bottom surface 821h of the storage space 821f as shown by solid-line arrows in FIG. 4, and forms a flow F of the processing liquid flowing toward the upper opening 821g from the bottom wall 821a of the processing tank 821, i.e. toward an overflow surface. In this way, upflows of the processing liquid are formed on the side below the substrates W. Note that, to facilitate the understanding of invention contents, the flow pipe 831 arranged furthest on a (−Y) side, out of the four flow pipes 831, is referred to as a "flow pipe 831a", and those successively arranged on a (+Y) side are respectively referred to as a "flow pipe 831b", a "flow pipe 831c" and a "flow pipe 831d". Further, if these are not distinguished, these are merely called the "flow pipes 831".

As shown in FIGS. 3 to 5, the bubble supplier 840 includes a plurality of (four in this embodiment) bubblers 841. Each bubbler 841 includes a bubble pipe 842 extending in the X direction and a plurality of projecting parts 843 projecting upward, i.e. in the (+Z) direction, from the bubble pipe 842. One end part of each bubble pipe 842 is connected to a gas supplier 844 for supplying the nitrogen gas, and the other end part thereof is sealed. The plurality of the projecting parts 843 are provided on an upper side wall of the bubble pipe 842 at the same pitches PT as the constant substrate pitches PT. Each projecting part 843 has a hollow cylindrical shape as shown in FIG. 3, and a bubble discharge port 845 is provided in a central part of an upper end surface. In this embodiment, the bubble pipe 842 and the plurality of projecting parts 843 are integrally formed by cutting and perforating a surface of a long resin pipe made of a resin material, particularly at least one selected from a group including polyether ether ketone (PEEK), perfluoroalkoxy alkane (PFA) and polytetrafluoroethylene (PTFE). Here, it goes without saying that the bubble pipe 842 and the plurality of projecting parts 843 may be individually prepared and the bubble pipe 842 and the plurality of projecting parts 843 may be integrated by mounting the projecting parts 843 on the bubble pipe 842.

In the bubble supplier 840 configured as just described, if the gas supplier 844 supplies the nitrogen gas to the bubble supplier 840 in response to a bubble supply command from the controller 9, the nitrogen gas flowing in the bubble pipes 842 is discharged upward from the bubble discharge ports 845. In this way, the bubbles V of the nitrogen gas are supplied to the processing liquid stored in the storage space 821f, and the bubbles V are supplied in a direction toward the overflow surface, i.e. in the (+Z) direction, from a position higher than the processing liquid discharge ports 834 in the vertical direction Z. These bubbles V ascend in the processing liquid and promote the replacement of the processing liquid on the surfaces of the substrates W by a fresh processing liquid. Note that the gas supplier 844 may be configured to supply the nitrogen gas from a cylinder filled with the nitrogen gas or a utility provided in a factory where the substrate processing system 1 is installed may be used as such.

Further, as shown in FIG. 4, the four bubblers 841 are fixedly arranged on a side below the substrates W held by the lifter 810a and above the processing liquid discharge ports 834 by being supported from below by three bubbler boards 851. Also here, to facilitate the understanding of the invention contents, the bubbler 841 arranged furthest on the (−Y) side, out of the four bubblers 841, is referred to as a "bubbler 841a", and those successively arranged on the (+Y) side are respectively referred to as a "bubbler 841b", a "bubbler 841c" and a "bubbler 841d". Further, if these are not distinguished, these are merely called the "bubblers 841". On the other hand, similarly, the bubbler board 851 arranged furthest on the (−Y) side, out of the bubbler boards 851, is referred to as a "bubbler board 851a", and those successively arranged on the (+Y) side are respectively referred to as a "bubbler board 851b" and a "bubbler board 851c". Further, if these are not distinguished, these are merely called the "bubbler boards 851".

Any of the bubbler boards 851a to 851c has a plate shape extending in the X direction. Out of these, the bubbler board 851a is arranged between the flow pipes 831a and 831b at a position higher than the processing liquid discharge ports 834 in the vertical direction Z as shown in FIG. 4. The bubbler 841a is fixed to the upper surface of the bubbler board 851a to satisfy the following arrangement relationship. That arrangement relationship is, as shown in FIG. 5, that the projecting parts 843 mounted on the bubblers 841 are facing upward and the substrates W and the bubble discharge ports 845 are alternately located in the X direction. By this arrangement, the bubbles V supplied from the bubble discharge ports 845 are discharged toward spaces between the substrates W adjacent in the X direction, and efficient chemical processing is performed. Note that this arrangement relationship applies also to the other bubblers 841b to 841d.

The bubbler board 851b is arranged between the flow pipes 831b and 831c at the position higher than the processing liquid discharge ports 834 in the vertical direction Z and fixed to the processing tank 821 by a fixing member (not shown). The bubblers 841b, 841c are fixed to the upper surface of the bubbler board 851b while being spaced apart by a certain distance in the Y direction. Further, the bubbler board 851c is arranged between the flow pipes 831c and 831d at the position higher than the processing liquid discharge ports 834 in the vertical direction Z and fixed to the processing tank 821 by a fixing member (not shown). The bubbler 841d is fixed to the upper surface of the bubbler board 851c. As just described, the bubbler boards 851a to 851c have a function of supporting the bubble supplier 840 from below.

Since the bubbler boards 851a to 851c are arranged between adjacent ones of the flow pipes 831a to 831d at the position higher than the processing liquid discharge ports 834 in the vertical direction Z, the bubbler boards 851a to 851c have a function of restricting the flow F of the processing liquid flowing upward by way of the inner bottom surface 821h of the storage space 821f, besides the above supporting function. The bubbler boards 851a to 851c are separated from each other and form through parts 852a, 852b serving as flow passages of the processing liquid. Lower end parts of the flow pipes 831b, 831c are arranged to enter the through parts 852a, 852b. Further, the flow pipe 831a is arranged on a (−Y) side of the bubbler board 851a and the flow pipe 831d is arranged on a (+Y) side of the bubbler board 851a at the same height position as the flow pipes 831b, 831c. Moreover, gaps 86 are formed between adjacent ones of the bubbler boards 851a to 851c and the flow pipes 831a to 831d. Thus, out of the upflow of the processing liquid, the flow F of the processing liquid flowing toward the lower surface of the bubbler board 851 (hereinafter, referred to as a "liquid to be split") is restricted by this lower surface and split in a horizontal plane. For example, in a partial enlarged view of FIG. 4, the flow F of the liquid to be split toward the lower surface of the bubbler board 851c is split into a flow F5 of the processing liquid flowing through the gap 86 between the bubbler board 851c and the flow pipe 831c and a flow F6 of the processing liquid flowing through the gap 86 between the bubbler board 851c and the flow pipe 831d. Further, similarly to the bubbler board 851c, the flow F of the liquid to be split is restricted and split into a plurality of flows F1 to F4 of the processing liquid also in the other bubbler boards 851a, 851b.

As just described, in this embodiment, the flow F of part (liquid to be split) of the processing liquid flowing upward by way of the inner bottom surface 821h of the storage space 821f is split into the plurality of flows F1 to F6 and ascends toward the overflow surface. As just described, in this embodiment, the bubbler boards 851a to 851c function as a splitter 850 (FIG. 3) for splitting the flow F of the liquid to be split, which is at least part of the processing liquid flowing upward by way of the inner bottom surface 821h of the storage space 821f, into a plurality of upflows and guiding the upflows to the substrates W held by the lifter 810a.

Note that although the configuration of the first chemical processor 81 corresponding to the first embodiment of the substrate processing apparatus according to the invention has been described with reference to FIGS. 2 to 5, the second chemical processor 83 has the same configuration as the first chemical processor 81 except that the type of the processing liquid is the same or different, and corresponds to the first embodiment of the substrate processing apparatus according to the invention. Further, the first rinsing processor 82 and the second rinsing processor 84 have the same configuration as the first chemical processor 81 except that the processing liquid is the rinse liquid such as pure water or DIW (deionized water), and correspond to the first embodiment of the substrate processing apparatus according to the invention.

As described above, according to this embodiment, the processing liquid is discharged from the processing liquid discharge ports 834 toward the inner bottom surface 821h of the storage space 821f and the flow F of the processing liquid is formed which flows toward the overflow surface by way of the inner bottom surface 821h. Thus, it can be suppressed that the upflows of the processing liquid are unevenly formed in the storage space 821f as compared to the conventional technique in which the processing liquid is discharged upward or obliquely upward from the side below the substrates W or discharged along the inner bottom surface of the storage space as in the apparatus described in patent literature 1. Moreover, a part of the flow F of the processing liquid flowing upward by way of the inner bottom surface 821h is guided toward the overflow surface after being split into the plurality of flows F1 to F6 between the bubble supplier 840 and the inner bottom surface 821h of the storage space 821f in the vertical direction Z. Accordingly, the processing liquid stored in the storage space 821f ascends while many upflows are formed and widely dispersed in the processing liquid. Therefore, the generation of downflows in the storage space 821f can be effectively suppressed. As a result, the bubbles V are uniformly supplied to the substrates W and substrate processing can be performed in high quality.

Particularly, since the first chemical processor 81 applies wet etching to the SiN films via the recesses having a high aspect ratio, the application of the invention to the first chemical processor 81 is important in the manufacturing of 3D-NAND memories. That is, the replacement of the processing liquid needs to be satisfactorily performed between the insides and outsides of the recesses to enhance wet etching performance. Further, silicon deposition associated with an etching reaction occurs near the bottoms of the recesses, but the silicon can be discharged from the recesses by the replacement of the processing liquid. To stably and continuously perform this liquid replacement, a concentration difference between the insides and outsides of the recesses, i.e. a concentration gradient, needs to be increased and uniformly maintained over the entire surfaces of the substrates W. Further, to satisfy these, it is an important technical matter to uniformly supply the fresh processing liquid to the surfaces of the substrates W. In this respect, according to the first chemical processor 81 capable of uniformly supplying the bubbles V to the substrates W, the SiN films can be satisfactorily wet-etched by the uniform supply of the processing liquid by the bubbles V.

Further, as shown in the partial enlarged view of FIG. 4, the bubbler board 851c and the bubbler 841d are arranged between the flow pipes 831c and 831d adjacent to each other. That is, the bubbler board 851c and the bubbler 841d are arranged between highest parts and lowest parts (processing liquid discharge ports 834) of the flow pipes 831c, 831d in the vertical direction Z. This point also holds true between the flow pipes 831a and 831b and between the flow pipes 831b and 831c. As just described, the processing liquid discharger 830, the bubble supplier 840 and the splitter 850 are accommodated within an outer diameter range of the flow pipes 831 in the vertical direction Z, and substrate processing can be performed in high quality without upsizing the processing tank 821 in the vertical direction Z.

Further, as shown in FIG. 4, the processing liquid discharger 830, the bubble supplier 840 and the splitter 850 are symmetrically arranged with respect to a virtual vertical plane VS passing through centers Wc of the substrates W held by the lifter 810a in the storage space 821f and orthogonal to the surfaces of the substrates W. Thus, the upflows generated in the processing liquid stored in the storage space 821f are also symmetrical with respect to the virtual vertical plane, the deviation of the upflows is suppressed and the generation of downflows can be effectively suppressed.

Further, as shown in a partial enlarged view of FIG. 5, since the bubbler 841d is so arranged that the substrates W and the bubble discharge ports 845 are alternately located in the X direction, the bubbles V can be efficiently supplied toward spaces between the substrates W adjacent to each other. As a result, substrate processings (chemical processing and rinse processing) can be performed in high quality.

Further, the bubbler boards 851a to 851c are located vertically right below the bubble supplier 840 to support the bubble supplier 840 from below. Thus, the bubble supplier 840 can be firmly fixed and the bubbles V can be supplied toward the spaces between the substrates W adjacent to each other.

Furthermore, as shown in FIG. 3, the through parts 852a, 852b are provided in a direction parallel to the arrangement direction X of the bubble discharge ports 845. Thus, a relative relationship of the flow of the processing liquid flowing upward through the through parts 852a, 852b and the flow of the bubbles V is constant in the X direction, and a disturbance in a supply direction of the bubbles V can be suppressed. As a result, the bubbles V can be stably supplied toward the spaces between the substrates W adjacent to each other.

As just described, in the first embodiment, the bubbler boards 851a to 851c correspond to an example of a "restricting part" of the invention. Further, the processing liquid flowing through the gaps 86 after being split by the lower surfaces of the bubbler boards 851a to 851c corresponds to "the processing liquid flowing in by way of the restricting part". Further, the X direction and the Y direction respectively correspond to a "first horizontal direction" and a "second horizontal direction" of the invention.

Figure 6:
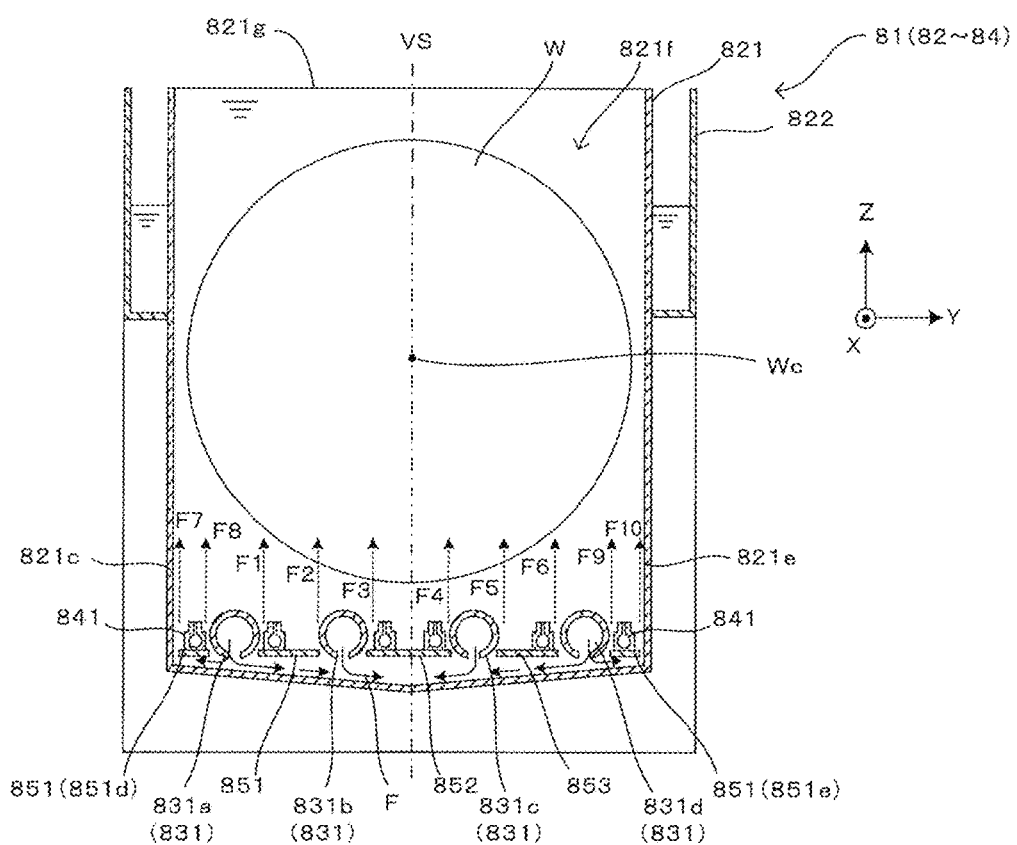
FIG. 6 is a partial sectional view showing a schematic configuration of a second embodiment of the substrate processing apparatus according to the invention.

FIG. 6 is a partial sectional view showing a schematic configuration of a second embodiment of the substrate processing apparatus according to the invention. This second embodiment largely differs from the first embodiment in that two bubbler boards 851 are added and two bubblers 841 are added, and the other configuration is the same as in the first embodiment. Thus, the following description is centered on points of difference and the same components are denoted by the same reference signs and not described.

In the first embodiment, as shown in FIG. 4, the processing liquid flowing in between the side wall 821c of the processing tank 821 and the flow pipe 831a by way of the inner bottom surface 821b directly ascends toward the overflow surface and forms the flow F of the processing liquid. In contrast, in the second embodiment, the bubbler board 851 (this is referred to as a "bubbler board 851d") is arranged between a side wall 821c of a processing tank 821 and a flow pipe 831a. Thus, the processing liquid corresponds to a liquid to be split, and the flow F thereof is restricted by the lower surface of the bubbler board 851d and split in a horizontal plane. As a result, the flow F of the liquid to be split is split into a flow F7 of the processing liquid flowing through a gap between the side wall 821c and the bubbler board 851d and a flow F8 of the processing liquid flowing through a gap between the bubbler board 851c and the flow pipe 831a. Further, similarly on the side of a side wall 821e of the processing tank 821, the bubbler board 851 (this is referred to as a "bubbler board 851e") is arranged between the side wall 821e of the processing tank 821 and a flow pipe 831d. Thus, the processing liquid flowing in therebetween corresponds to the liquid to be split, and a flow F thereof is restricted by the lower surface of the bubbler board 851e and split in a horizontal plane. As a result, the flow F of the liquid to be split is split into a flow F9 of the processing liquid flowing through a gap between the bubbler board 851e and the flow pipe 831d and a flow F10 of the processing liquid flowing through a gap between the side wall 821e and the bubbler board 851e.

As just described, according to the second embodiment, not only many upflows are widely dispersed and formed in a central part of the storage space 821f as in the first embodiment, but also many upflows are widely dispersed and formed in end parts of the storage space 821f. That is, the entire flow F of the processing liquid flowing upward by way of the inner bottom surface 821h is guided toward the overflow surface while being split into a plurality of flows. Thus, the generation of downflows in the storage space 821f can be more effectively suppressed. As a result, bubbles V are uniformly supplied to the substrates W and substrate processing can be performed in higher quality.

Further, since the bubblers 841 are additionally disposed on the bubbler boards 851d, 851e in the second embodiment, a supply range of the bubbles V can be widened and substrate processing can be performed in higher quality.

Figure 7:
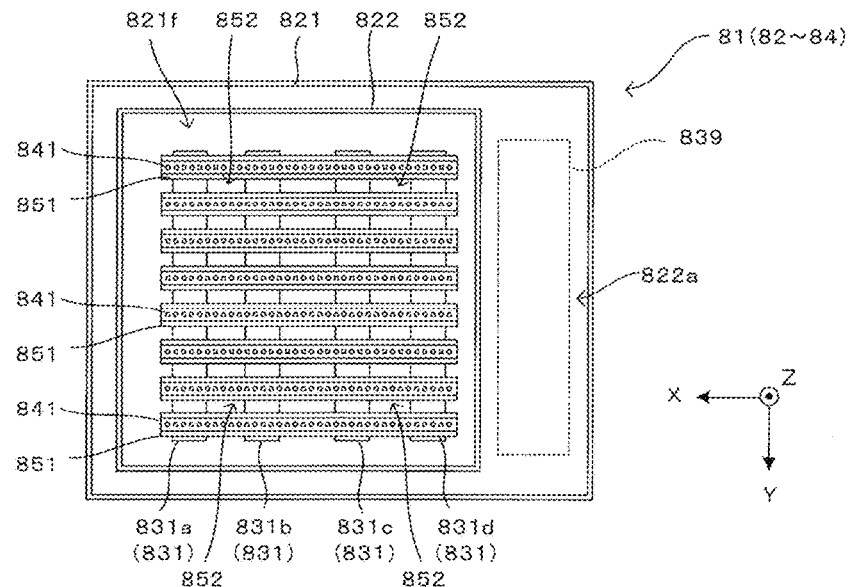
FIG. 7 is a plan view showing a schematic configuration of a third embodiment of the substrate processing apparatus according to the invention.
Figure 8:
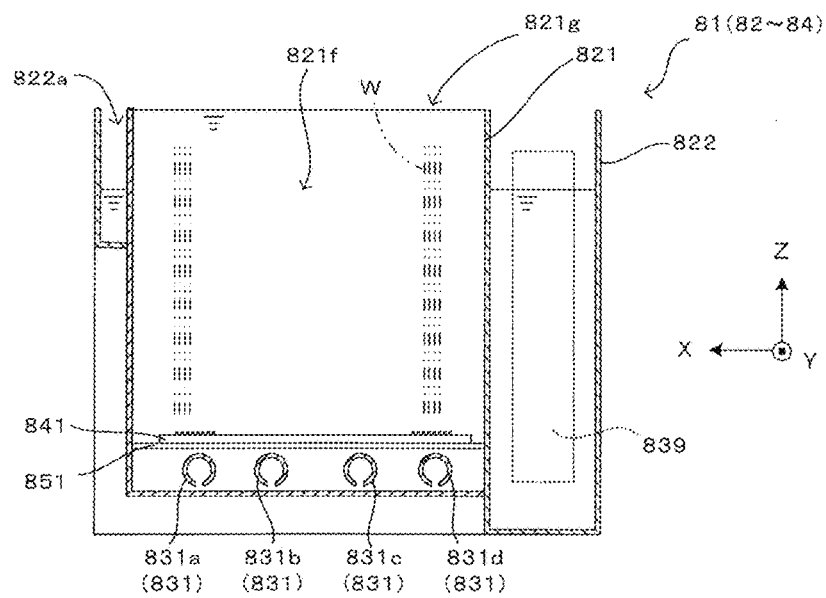
FIG. 8 is a sectional view showing a schematic configuration of the third embodiment of the substrate processing apparatus according to the invention.

FIG. 7 is a plan view showing a schematic configuration of a third embodiment of the substrate processing apparatus according to the invention. FIG. 8 is a sectional view showing a schematic configuration of the third embodiment of the substrate processing apparatus according to the invention. This third embodiment largely differs from the first embodiment in the numbers of bubblers 841 and bubbler boards 851 and a relative positional relationship of flow pipes 831, the bubblers 841 and the bubbler boards 851, and the other configuration is the same as in the first embodiment. Thus, the following description is centered on points of difference and the same components are denoted by the same reference signs and not described.

In the third embodiment, four flow pipes 831 are arranged at positions right above an inner bottom surface 821h of a storage space 821f while being spaced apart in the X direction. Each flow pipe 831 extends in the Y direction and is arranged in such a posture that processing liquid discharge ports 834 face the inner bottom surface 821h. Further, a plurality of (eight in the third embodiment) bubbler boards 851 are arranged at positions right above the flow pipes 831 while being spaced apart in the Y direction. Each bubbler board 851 extends in the X direction. Thus, the flow pipes 831 and the bubbler boards 851 are orthogonal to each other and a lattice structure is formed in a plan view from above. Therefore, a processing liquid discharged from the processing liquid discharge ports 834 of the flow pipes 831 flows upward through spaces between adjacent ones of the flow pipes 831 by way of the inner bottom surface 821h. Part (liquid to be split) of this processing liquid is restricted by the lower surfaces of the bubbler boards 851, split in a horizontal plane and ascends toward an overflow surface through through parts 852, where the flow pipes 831 and the bubbler boards 851 are not present, in a plan view. As just described, as in the first and second embodiments, the flow of the liquid to be split is split into a plurality of flows by the bubbler boards 851. As a result, functions and effects similar to those of the first and second embodiments are obtained.

Further, the bubbler 841 is fixed on each bubbler board 851, but an arrangement relationship of the bubble discharge ports 845 of the bubbler 841 and the substrates W is the same as in the first and second embodiments, and the bubbles V can be efficiently supplied toward spaces between the substrates W adjacent to each other. As a result, substrate processings (chemical processing and rinse processing) can be performed in high quality.

Although the bubble boards 851 constituting the splitter 850 are arranged between adjacent ones of the flow pipes 831 in the first and second embodiments, the bubbler boards 851 may be arranged at positions right above the flow pipes 831 and the bubblers 841 may be arranged above the bubbler boards 851 (fourth embodiment).

Figure 9:
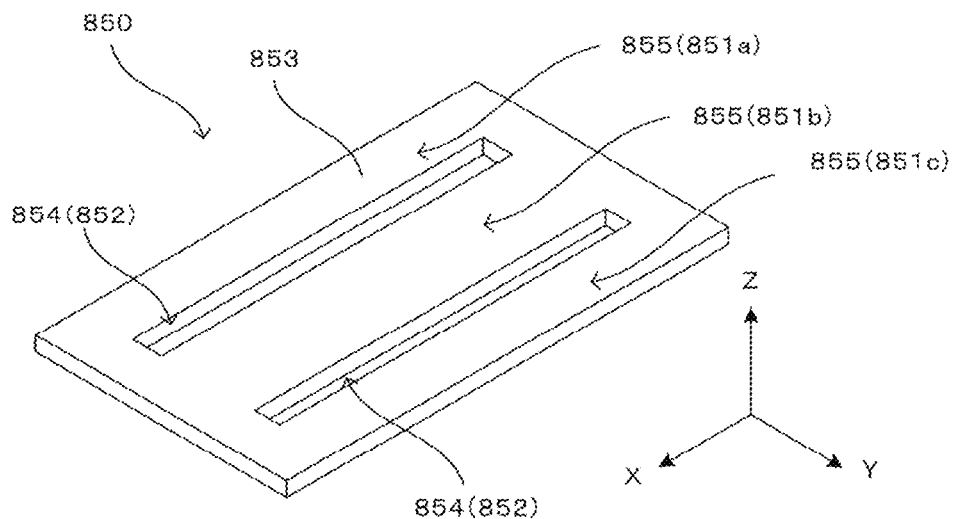
FIG. 9 is a view schematically showing a configuration of a splitter used in the fifth embodiment of the substrate processing apparatus according to the invention.

Further, although the splitter 850 is configured by arranging three independent bubbler boards 851 apart from each other in the Y direction in the first to fourth embodiments, the configuration of the splitter 850 is not limited to this and the splitter 850 may be, for example, configured as shown in FIG. 9 (fifth embodiment).

FIG. 9 is a view schematically showing a configuration of a splitter used in the fifth embodiment of the substrate processing apparatus according to the invention. In this fifth embodiment, one plate member 853 provided with slits 854 extending in the X direction and spaced apart in the Y direction is used as the splitter 850. In this fifth embodiment, the slits 854 function as through parts 852, each strip-like region 855 separated by the slits 854 functions as a bubbler board 851, and functions and effects similar to those of the above embodiments are obtained.

Figure 10:
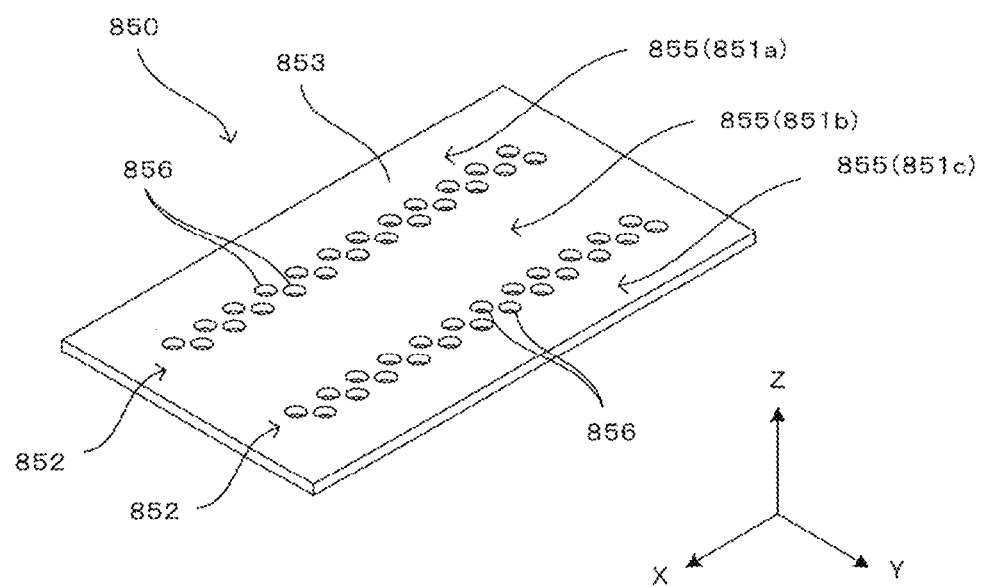
FIG. 10 is a view schematically showing a configuration of a splitter used in the sixth embodiment of the substrate processing apparatus according to the invention.

Further, although the splitter 850 is configured by arranging the plurality of independent bubbler boards 851 spaced apart from each other in the Y direction at the positions right above the flow pipes 831 in the third and fourth embodiments, the splitter 850 may be, for example, configured as shown in FIG. 10 (sixth embodiment).

FIG. 10 is a view schematically showing a configuration of a splitter used in the sixth embodiment of the substrate processing apparatus according to the invention. In this sixth embodiment, a plurality of through holes 856 are perforated in a plate member 853 as shown in FIG. 10 instead of providing the slits 854 in the plate member 853. That is, in the sixth embodiment, groups of the through holes function as through parts 852, each strip-like region 855 separated by the groups of the through holes functions as a bubbler board 851, and functions and effects similar to those of the above embodiments are obtained.

Further, in the above embodiments, the bubblers 841 are fixedly arranged in the processing liquid stored in the storage space 821h by being supported by the bubbler boards 851 of the splitter 850 and the flow F of the processing liquid flowing upward by way of the inner bottom surface 821h is split into a plurality of flows by the bubbler boards 851. Here, for example, in the case of directly fixing the bubbler boards 851 to the processing tank 821, the bubblers 841 may be, for example, arranged between adjacent ones of the flow pipes 831 as shown in FIG. 11 (seventh embodiment).

Figure 11:
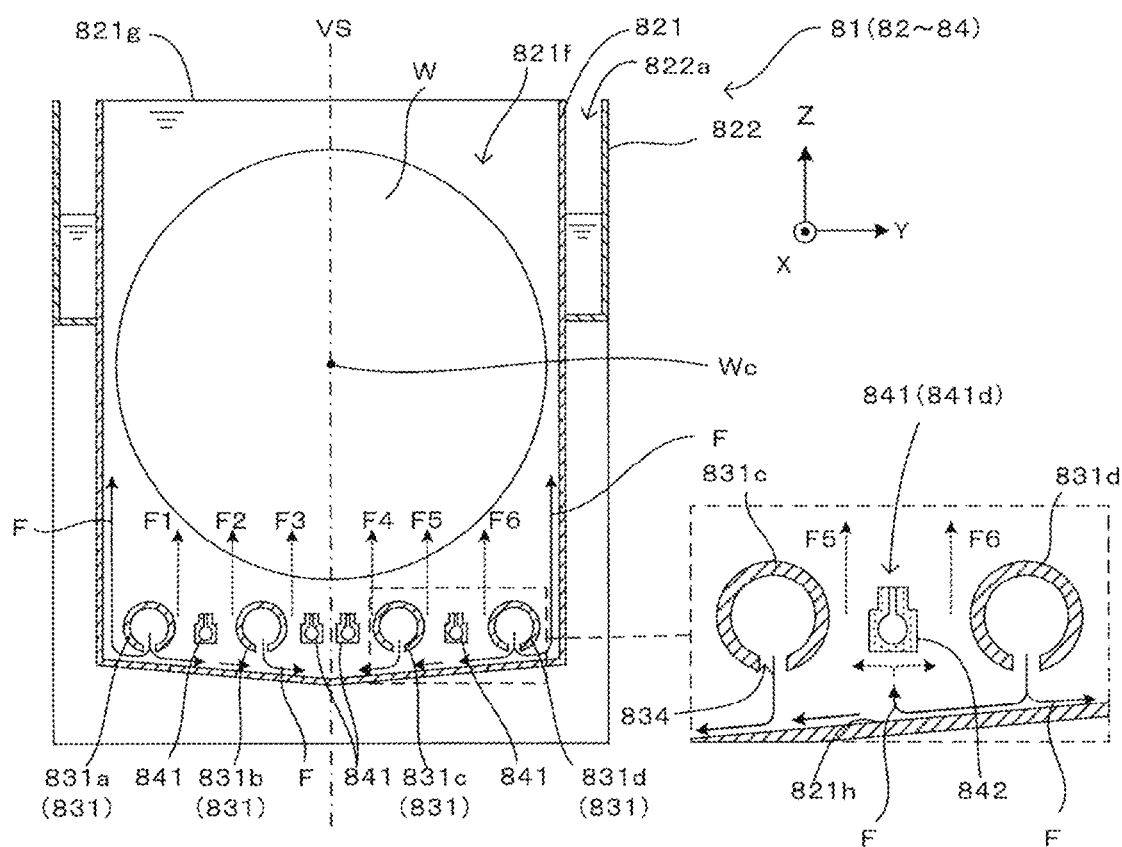
FIG. 11 is a sectional view showing a schematic configuration of the seventh embodiment of the substrate processing apparatus according to the invention.

FIG. 11 is a sectional view showing a schematic configuration of the seventh embodiment of the substrate processing apparatus according to the invention. In this seventh embodiment, as shown in FIG. 11, a processing liquid discharged from processing liquid discharge ports 834 of flow pipes 831 passes through spaces between adjacent ones of the flow pipes 831 by way of an inner bottom surface 821h and flows upward. Part (liquid to be split) of this processing liquid is restricted by the lower surfaces of bubble pipes 842 of bubblers 841, split in a horizontal plane and ascends toward an overflow surface. As just described, the flow of the liquid to be split is split into a plurality of flows by the bubblers 841. As a result, functions and effects similar to those of the first and second embodiments are obtained. Further, the apparatus can be simplified by as much as the splitter 850 is omitted.

Further, in the above embodiments, part or all of the processing liquid flowing upward by way of the inner bottom surface 821h is the liquid to be split and the generation of downflows is suppressed by splitting the flow of the liquid to be split. In addition to this, another configuration for suppressing the generation of downflows may be added. For example, as shown in FIG. 12, side wall openings 821i to 821l may be provided in the processing tank 821 (eighth embodiment).

Figure 12:
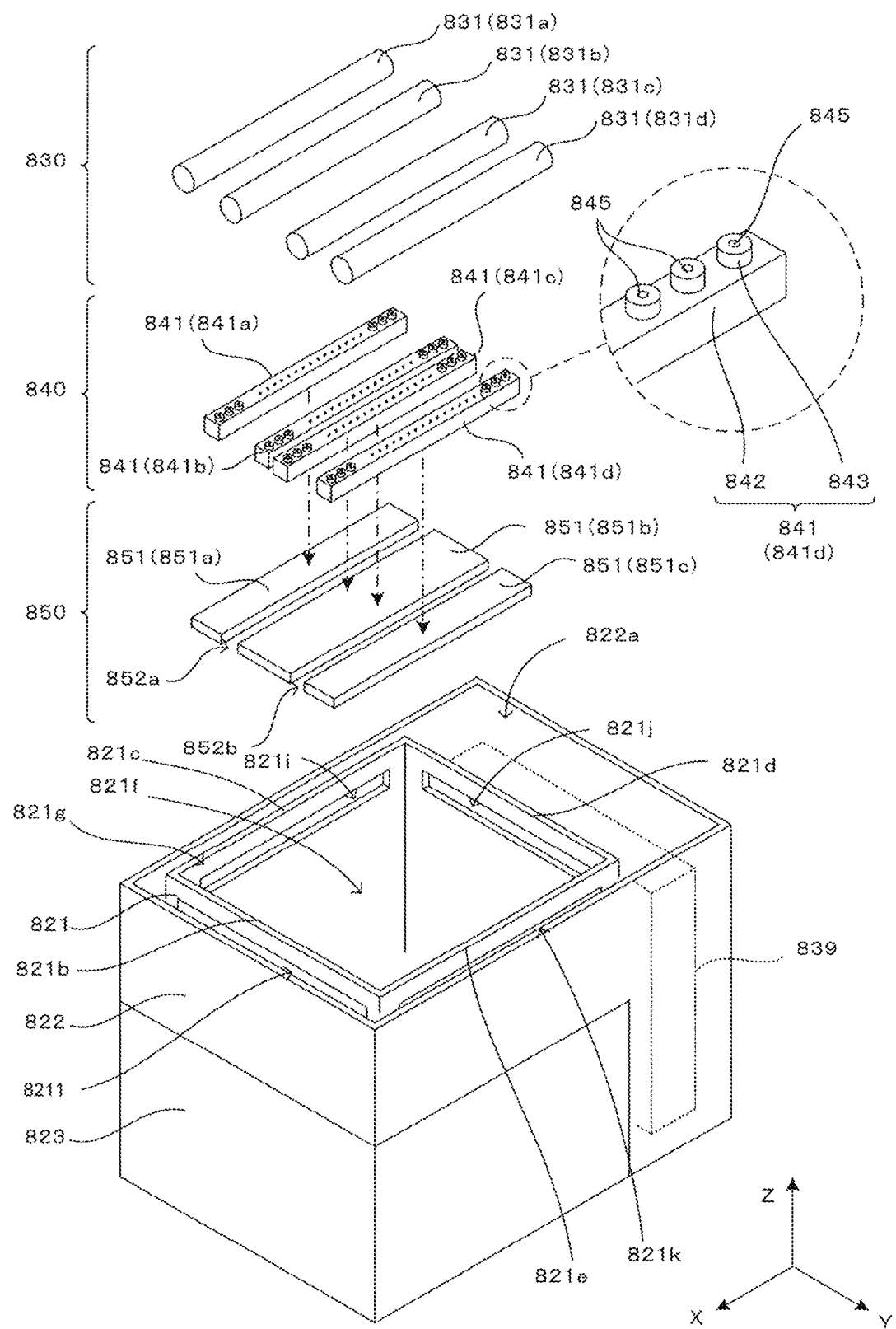
FIG. 12 is a view showing a configuration of a processing tank used in the eighth embodiment of the substrate processing apparatus according to the invention.

FIG. 12 is a view showing a configuration of a processing tank used in the eighth embodiment of the substrate processing apparatus according to the invention. The eighth embodiment largely differs from the first embodiment (FIG. 3) is that the side wall openings 821i to 821l are provided in substrate facing regions facing substrates W immersed in a processing liquid in all side walls 821b to 821e of the processing tank 821, and the other configuration is the same as in the first embodiment. Thus, the following description is centered on points of difference and the same components are denoted by the same reference signs and not described.

In the eighth embodiment, a storage space 821f and a collection space 822a are allowed to communicate by the side wall opening 821i to 821l. Thus, the processing liquid flowing toward an upper opening 821g is split into flows overflowing via the upper opening 821g and discharged from the processing tank 821 to the collection space 822a and flows discharged from the processing tank 821 to the collection space 822a via the side wall openings 821i to 821l. Downflows are more effectively suppressed by such split of the processing liquid at positions near an overflow surface, and bubbles V can be more uniformly supplied to the substrates W. As a result, substrate processing can be performed in higher quality.

To further suppress the generation of downflows, the technique described in JP H11-102888A, i.e. a technique for suppressing downflows by adding a cover for limiting an area of the upper opening 821g, may be additionally applied to the above embodiments.

Figure 13:
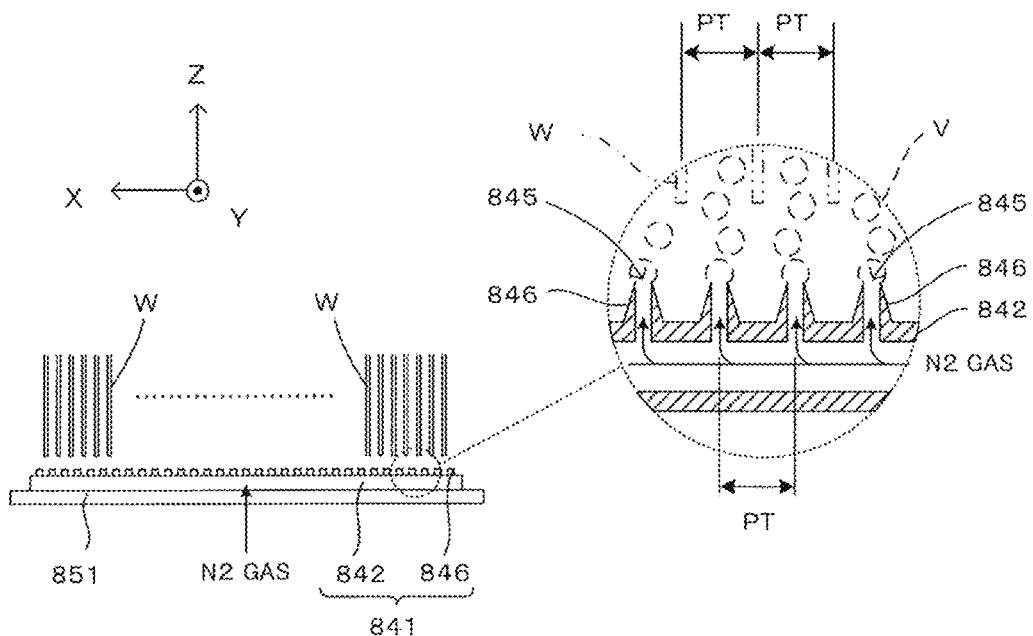
FIG. 13 is a view showing a configuration of bubblers used in the ninth embodiment of the substrate processing apparatus according to the invention.
Figure 14:
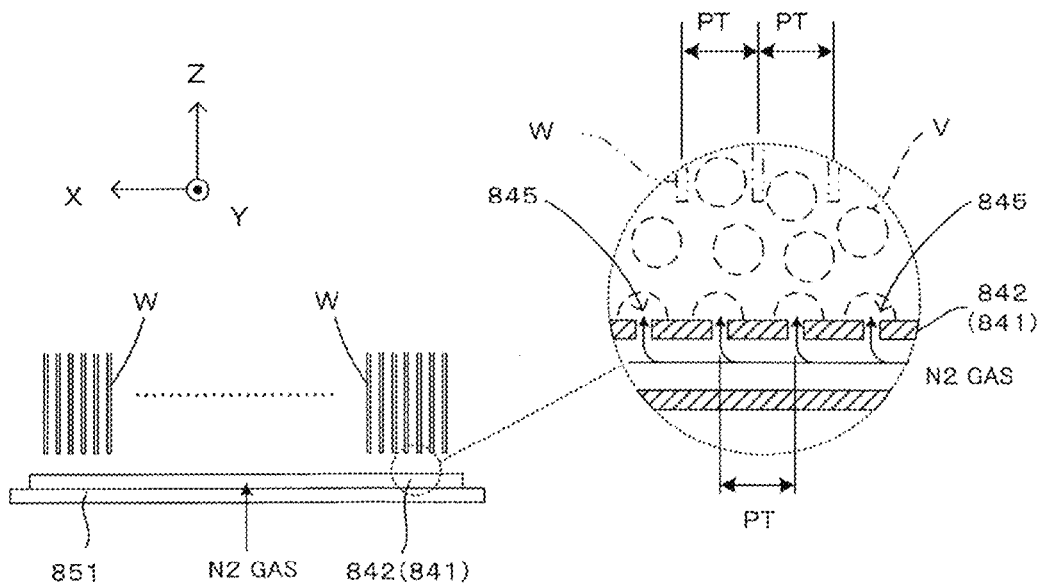
FIG. 14 is a view showing a configuration of bubblers used in the tenth embodiment of the substrate processing apparatus according to the invention.

Note that the invention is not limited to the embodiments described above and various changes other than the aforementioned ones can be made without departing from the gist of the invention. For example, although the bubbles V are supplied using the bubblers 841 provided with the hollow cylindrical projecting parts 843 projecting from the bubble pipes 842 in the above embodiments, the configuration of the bubblers 841 is not limited to this. For example, as shown in FIG. 13, bubblers in which hollow conical projecting parts 846 project from a bubble pipe 842 may be used (ninth embodiment). Further, bubblers provided with no projecting part, for example, as shown in FIG. 14, i.e. bubblers in which bubble discharge ports 845 are perforated in the upper surface of a bubble pipe 842, may be used (tenth embodiment).

Further, although the processing liquid discharger 830 includes four flow pipes 831 in the above embodiments, the number of the flow pipes 831 is not limited to this and is desirably set according to the sizes of the storage space 821f, the substrates W and the like. Further, although the number of the bubbler boards 851 included in the bubble supplier 840 is four (first embodiment, seventh embodiment, etc.), six (second embodiment) and eight (third embodiment), the number of the bubbler boards 851 is not limited to this and is desirably set according to the sizes of the storage space 821f, the substrates W and the like. Further, although the number of the bubbler boards 851 included in the splitter 850 is three (first embodiment, seventh embodiment, etc.), five (second embodiment) and eight (third embodiment), the number of the bubbler boards 851 is not limited to this and is desirably set according to the sizes of the storage space 821f, the substrates W and the like.

Further, in the above embodiments, the processing liquid discharge ports 834 are open toward the inner bottom surface 821h of the storage space 821f and the processing liquid is discharged to the inner bottom surface 821h, for example, as shown in FIG. 4. Here, a means for causing the processing liquid to flow to the inner bottom surface 821h is not limited to this (e.g. eleventh and twelfth embodiments).

Figure 15:
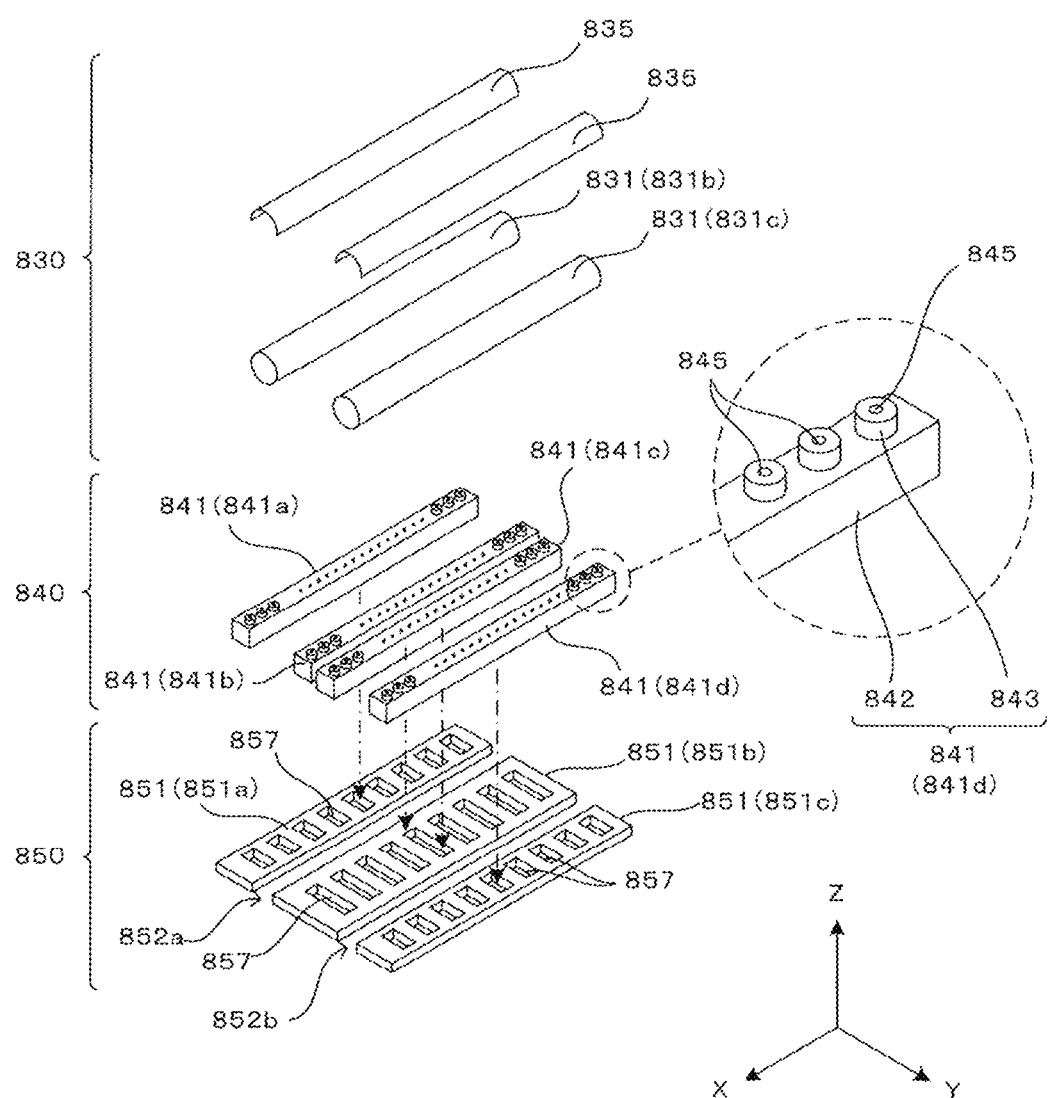
FIG. 15 is an exploded assembly perspective view partially showing a main configuration of the eleventh embodiment of the substrate processing apparatus according to the invention.
Figure 16:
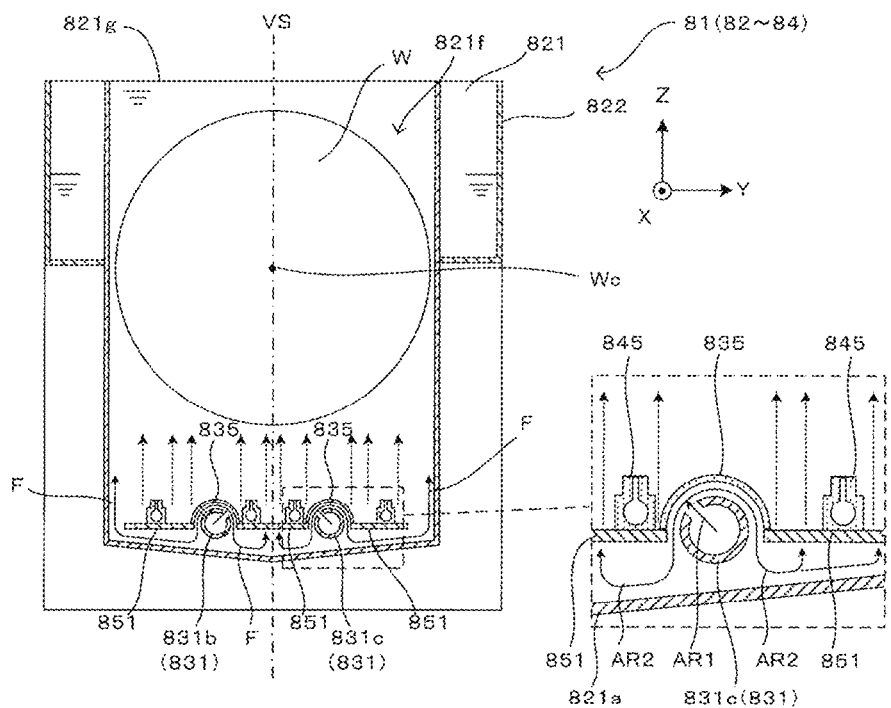
FIG. 16 is a partial sectional view of the substrate processing apparatus according to the eleventh embodiment.

FIG. 15 is an exploded assembly perspective view partially showing a main configuration of the eleventh embodiment of the substrate processing apparatus according to the invention. FIG. 16 is a partial sectional view of the substrate processing apparatus according to the eleventh embodiment. This eleventh embodiment largely differs from the first embodiment (FIG. 4) in the number and arrangement of flow pipes 831, the addition of cover members 835 and the addition of slits 857 functioning as through parts 852 to bubbler boards 851, and the other configuration is the same as in the first embodiment. Thus, the following description is centered on points of difference and the same components are denoted by the same reference signs and not described.

In the eleventh embodiment, the flow pipes 831 are arranged as in a conventional apparatus. That is, processing liquid discharge ports 834 of the flow pipes 831 are open toward lower end parts of substrates W held by an unillustrated lifter (substrate holder). Thus, if a processing liquid supplier 832 operates in response to a processing liquid supply command from a controller 9, the processing liquid is discharged from the flow pipes 831 toward the substrates W as indicated by an arrow AR1 in an enlarged view of FIG. 16. However, in this embodiment, the cover members 835 are arranged to cover the flow pipes 831 from above and guide the processing liquid toward an inner bottom surface 821h of a storage space 821f as indicated by arrows AR2 in this enlarged view. This causes the processing liquid to flow upward by way of the inner bottom surface 821h as in the first to tenth embodiments. That is, a liquid to be split is formed. Part of the liquid to be split is restricted by the lower surfaces of the bubbler boards 851 and split in a horizontal plane. The split processing liquid passes through the slits 857 (through parts 852) of the bubbler boards 851 and ascends toward an overflow surface. In this way, the flow of the liquid to be split is split into a plurality of flows by the bubbler boards 851 as in the above embodiments. As a result, the generation of downflows in the storage space 821f is effectively suppressed and substrate processing can be performed in high quality.

In the eleventh embodiment, the flow of the processing liquid right above the cover members 835 tends to be reduced by providing the cover members 835. Accordingly, through holes 836 may be provided in parts of the cover members 835 as shown in FIG. 17 to feed part of the processing liquid also right above the cover members 835 (twelfth embodiment).

Figure 17:
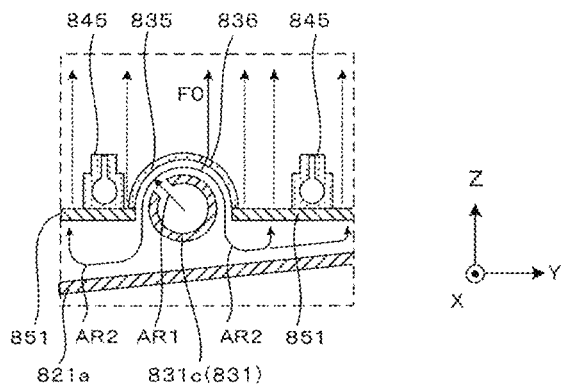
FIG. 17 is a partial sectional view of the twelfth embodiment of the substrate processing apparatus according to the invention.

FIG. 17 is a partial sectional view of the twelfth embodiment of the substrate processing apparatus according to the invention. In this twelfth embodiment, the through holes 836 are provided in the cover members 835 at positions not facing processing liquid discharge ports 834. Thus, a processing liquid discharged from the processing liquid discharge ports 834 flows along curved lower surfaces of the cover members 835, partially passes through the through holes 836 and flows toward lower end parts of substrates W from the cover members 835 (see an arrow F0 of FIG. 17). On the other hand, the other processing liquid becomes a liquid to be split as in the eleventh embodiment, and part of the liquid to be split is restricted by the lower surfaces of bubbler boards 851 and split in a horizontal plane. By adding flows F0 of the processing liquid for regions right above the cover members 835 in this way, the generation of downflows in a storage space 821f can be more effectively suppressed. As a result, bubbles V can be more uniformly supplied to the substrates W and substrate processing can be performed in higher quality.

Further, although the nitrogen gas is fed to the bubblers 841 to supply the bubbles V into the processing liquid in the above embodiments, a gas other than the nitrogen gas may be used as a "gas" of the invention.

Furthermore, although the invention is applied to the substrate processing apparatuses for performing the chemical processing using the chemical containing a phosphoric acid and the substrate processing apparatuses for performing the rinse processing in the above embodiments, the application range of the invention is not limited to this and the invention can be applied to substrate processing techniques in general for performing substrate processing by immersing substrates in a processing liquid other than the chemical and the rinse liquid.

Although the invention has been described by way of the specific embodiments above, this description is not intended to be interpreted in a limited sense. By referring to the description of the invention, various modifications of the disclosed embodiments will become apparent to a person skilled in this art similarly to other embodiments of the invention. Hence, appended claims are thought to include these modifications and embodiments without departing from the true scope of the invention.

INDUSTRIAL APPLICABILITY

The invention is generally applicable to a substrate processing technique for processing a substrate by immersing the substrate into a processing liquid stored in a processing tank while overflowing the processing liquid from the processing tank and supplying bubbles to the substrate into the processing liquid.

REFERENCE SIGNS LIST

81 . . . first chemical processor (substrate processing apparatus)
82 . . . first rinsing processor (substrate processing apparatus)
83 . . . second chemical processor (substrate processing apparatus)
84 . . . second rinsing processor (substrate processing apparatus)
810, 810a, 810b . . . lifter (substrate holder)
821 . . . processing tank
821a . . . bottom wall (of processing tank)
821b-821e . . . side wall (of processing tank)
822 . . . overflow tank
822a . . . collection space 830 . . . processing liquid discharger
831, 831a-831d . . . flow pipe
834 . . . processing liquid discharge ports
835 . . . cover members
836 . . . through holes
840 . . . bubble supplier
841, 841a-841d . . . bubbler
845 . . . bubble discharge port
850 . . . splitter
851, 851a-851e . . . bubbler board
852, 852a, 852b . . . through part
V . . . bubble
VS . . . virtual vertical plane
W . . . substrate
Wc . . . center (of substrate)
X . . . first horizontal direction
Y . . . second horizontal direction
Z . . . vertical direction

The invention claimed is:

1. A substrate processing apparatus, comprising: a processing tank, having a storage space, configured to process a substrate that is immersed into a processing liquid stored in the storage space and overflowed from an upper opening of the storage space; a substrate holder configured to hold the substrate in a standing posture in the storage space; a plurality of processing liquid dischargers including a plurality of processing liquid discharge ports configured to discharge the processing liquid on a side below the substrate held by the substrate holder, the plurality of processing liquid dischargers causing the processing liquid discharged from the plurality of processing liquid discharge ports to flow toward an inner bottom surface of the storage space; and a bubble supplier provided on a side below the substrate held by the substrate holder and above the processing liquid discharge ports and configured to supply bubbles to the processing liquid stored in the storage space, the bubble supplier is arranged between the plurality of processing liquid dischargers in a horizontal plane, wherein at least part of the processing liquid flowing upward by way of the inner bottom surface of the storage space becoming a liquid to be split between the bubble supplier and the inner bottom surface of the storage space in a vertical direction, and a flow of the liquid to be split is split into a plurality of upflows and guided to the substrate held by the substrate holder, wherein the plurality of processing liquid discharge ports face downward.

2. The substrate processing apparatus according to claim 1, further comprising a splitter configured to split the flow of the liquid to be split into the plurality of upflows, wherein:
the splitter includes:
a restricting part configured to restrict an upward flow of the liquid to be split and split the liquid to be split in a horizontal plane; and
a plurality of through parts provided to penetrate in the vertical direction in the horizontal plane while being adjacent to the restricting part, the plurality of through parts guiding the processing liquid flowing in by way of the restricting part toward the substrate held by the substrate holder.

3. The substrate processing apparatus according to claim 2, wherein: the plurality of processing liquid dischargers include a plurality of flow pipes extending in a first horizontal direction, the plurality of processing liquid discharge ports being provided in a side wall of each flow pipe while being arranged in the first horizontal direction, and the plurality of flow pipes are arranged apart from each other in a second horizontal direction orthogonal to the first horizontal direction and the restricting part is arranged between the flow pipes adjacent to each other in the second horizontal direction.

4. The substrate processing apparatus according to claim 3, wherein: the restricting part is further arranged between a flow pipe and the processing tank adjacent to each other in the second horizontal direction.

5. The substrate processing apparatus according to claim 2, wherein:
the substrate holder is configured to hold a plurality of substrates in addition to the substrate while spacing the substrates apart from each other in a first horizontal direction,
the bubble supplier includes a plurality of bubblers extending in the first horizontal direction, a plurality of bubble discharge ports configured to discharge the bubbles being provided in a side wall of each bubbler while being arranged in the first horizontal direction,
the substrates and the bubble discharge ports are alternately located in the first horizontal direction, and
each of the bubble discharge ports is configured to discharge the bubbles toward a space between the substrates adjacent in the first horizontal direction.

6. The substrate processing apparatus according to claim 2, wherein: the restricting part extends in a first horizontal direction, and the plurality of processing liquid dischargers include a plurality of flow pipes extending in a second horizontal direction orthogonal to the first horizontal direction, the plurality of processing liquid discharge ports being provided in a side wall of each flow pipe while being arranged in the second horizontal direction.

7. The substrate processing apparatus according to claim 6, wherein:
the substrate holder is configured to hold a plurality of substrates in addition to the substrate so as to space the substrates apart from each other in the first horizontal direction,
the bubble supplier includes a plurality of bubblers extending in the first horizontal direction, a plurality of bubble discharge ports for discharging the bubbles being provided in a side wall of each bubbler while being arranged in the first horizontal direction,
the substrates and the bubble discharge ports are alternately located in the first horizontal direction, and
each of the bubble discharge ports is configured to discharge the bubbles toward a space between the substrates adjacent in the first horizontal direction.

8. The substrate processing apparatus according to claim 2, wherein:
the restricting part is located vertically right below the bubble supplier to support the bubble supplier from below.

9. The substrate processing apparatus according to claim 5, wherein:
the through parts extend in a direction parallel to an arrangement direction of the bubble discharge ports.

10. The substrate processing apparatus according to claim 1, wherein: the plurality of processing liquid dischargers include a plurality of flow pipes extending in a first horizontal direction, a plurality of the processing liquid discharge ports being provided in a side wall of each flow pipe while being arranged in the first horizontal direction, the bubble supplier includes a bubbler extending in the first horizontal direction, a plurality of bubble discharge ports for discharging the bubbles being provided in a side wall of the bubbler while being arranged in the first horizontal direction, and the bubbler is arranged between the flow pipes adjacent to each other in a second horizontal direction orthogonal to the first horizontal direction and configured to split a flow of the liquid to be split flowing between the adjacent flow pipes into a plurality of upflows.

11. The substrate processing apparatus according to claim 1, wherein: the plurality of processing liquid dischargers and the bubble supplier are symmetrically arranged with respect to a virtual vertical plane passing through a center of the substrate held by the substrate holder in the storage space and orthogonal to a surface of the substrate.

12. The substrate processing apparatus according to claim 2, wherein: the plurality of processing liquid dischargers, the bubble supplier and the splitter are symmetrically arranged with respect to a virtual vertical plane passing through a center of the substrate held by the substrate holder in the storage space and orthogonal to a surface of the substrate.

13. The substrate processing apparatus according to claim 1, wherein:
   a side wall opening is provided in a region near the upper opening, out of a side wall of the processing tank, and
   the processing liquid flowing toward the upper opening is split into a flow overflowing via the upper opening and a flow discharged from the processing tank via the side wall opening.

14. The substrate processing apparatus according to claim 1, wherein: the plurality of processing liquid discharge ports are open toward the inner bottom surface of the storage space.

15. The substrate processing apparatus according to claim 1, wherein: the plurality of processing liquid discharge ports are open toward the substrate held by the substrate holder, and the plurality of processing liquid dischargers include a cover member configured to guide the processing liquid discharged from the plurality of processing liquid discharge ports toward the inner bottom surface of the storage space.

16. The substrate processing apparatus according to claim 15, wherein: the cover member includes a through hole configured to cause part of the processing liquid discharged from the plurality of processing liquid discharge ports to flow toward the substrate held by the substrate holder.

17. A substrate processing apparatus, comprising: a processing tank, having a storage space, configured to process a substrate that is immersed into a processing liquid stored in the storage space and overflowed from an upper opening of the storage space; a substrate holder configured hold the substrate in a standing posture in the storage space; a processing liquid discharger including a plurality of processing liquid discharge ports configured to discharge the processing liquid on a side below the substrate held by the substrate holder, the processing liquid discharger causing the processing liquid discharged from the processing liquid discharge ports to flow toward an inner bottom surface of the storage space; and a bubble supplier provided on a side below the substrate held by the substrate holder and above the processing liquid discharge ports and configured to supply bubbles to the processing liquid stored in the storage space; a splitter configured to split a flow of the liquid to be split into a plurality of upflows, the splitter including a restricting part configured to restrict an upward flow of the liquid to be split and split the liquid to be split in a horizontal plane; and a plurality of through parts provided to penetrate in a vertical direction in the horizontal plane while being adjacent to the restricting part, the plurality of through parts guiding the processing liquid flowing in by way of the restricting part toward the substrate held by the substrate holder, wherein at least part of the processing liquid flowing upward by way of the inner bottom surface of the storage space becoming a liquid to be split between the bubble supplier and the inner bottom surface of the storage space in a vertical direction, wherein the flow of the liquid to be split is split into the plurality of upflows is guided to the substrate held by the substrate holder, wherein the processing liquid discharger includes a plurality of flow pipes extending in a first horizontal direction, a plurality of the processing liquid discharge ports being provided in a side wall of each flow pipe while being arranged in the first horizontal direction, and wherein the plurality of flow pipes are arranged apart from each other in a second horizontal direction orthogonal to the first horizontal direction and the restricting part is arranged between the flow pipes adjacent to each other in the second horizontal direction.

* * * * *